United States Patent
Yano et al.

(10) Patent No.: US 8,461,583 B2
(45) Date of Patent: Jun. 11, 2013

(54) OXIDE SEMICONDUCTOR FIELD EFFECT TRANSISTOR AND METHOD FOR MANUFACTURING THE SAME

(75) Inventors: Koki Yano, Chiba (JP); Hirokazu Kawashima, Chiba (JP); Kazuyoshi Inoue, Chiba (JP); Shigekazu Tomai, Chiba (JP); Masashi Kasami, Chiba (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 126 days.

(21) Appl. No.: 12/810,189

(22) PCT Filed: Dec. 19, 2008

(86) PCT No.: PCT/JP2008/073252
§ 371 (c)(1), (2), (4) Date: Jun. 23, 2010

(87) PCT Pub. No.: WO2009/081885
PCT Pub. Date: Jul. 2, 2009

(65) Prior Publication Data
US 2010/0276688 A1 Nov. 4, 2010

(30) Foreign Application Priority Data
Dec. 25, 2007 (JP) .................. 2007-332508
Dec. 28, 2007 (JP) .................. 2007-338918

(51) Int. Cl.
*H01L 29/786* (2006.01)
*H01L 29/221* (2006.01)

(52) U.S. Cl.
USPC ........... 257/43; 257/66; 257/76; 257/57; 438/151; 438/483

(58) Field of Classification Search
USPC .......... 438/29, 608, 609, 720, 722, 742, 438/754, FOR. 405; 257/43, E33.064, E31.126, 257/E21.28, E23.155, 65, 66, 76, E29.296, 257/E21.494; 252/500, 506, 508, 518.1, 519.15, 252/520.1, 521.1, 521.3, 521.4; 204/298.13, 204/192.25, 192.29
See application file for complete search history.

(56) References Cited

U.S. PATENT DOCUMENTS 6,563,174 B2    5/2003  Kawasaki et al.
2002/0155319 A1* 10/2002 Kawamura et al. .......... 428/690

(Continued)

FOREIGN PATENT DOCUMENTS

CN    1 918 672      2/2007
EP    1 983 499 A1   10/2008

(Continued)

OTHER PUBLICATIONS

International Search Report of PCT/JP2008/073252 (Feb. 9, 2009).

(Continued)

*Primary Examiner* — Olik Chaudhuri
*Assistant Examiner* — Quovaunda V Jefferson
(74) *Attorney, Agent, or Firm* — Oblon, Spivak, McClelland, Maier & Neustadt, L.L.P.

(57) ABSTRACT

A field effect transistor including a semiconductor layer including a composite oxide which contains In, Zn, and one or more elements X selected from the group consisting of Zr, Hf, Ge, Si, Ti, Mn, W, Mo, V, Cu, Ni, Co, Fe, Cr, Nb, Al, B, Sc, Y and lanthanoids in the following atomic ratios (1) to (3):

$$In/(In+Zn)=0.2 \text{ to } 0.8 \quad (1)$$

$$In/(In+X)=0.29 \text{ to } 0.99 \quad (2)$$

$$Zn/(X+Zn)=0.29 \text{ to } 0.99 \quad (3).$$

17 Claims, 4 Drawing Sheets

U.S. PATENT DOCUMENTS

| | | |
|---|---|---|
| 2003/0047785 A1 | 3/2003 | Kawasaki et al. |
| 2005/0199959 A1 | 9/2005 | Chiang et al. |
| 2006/0108636 A1 | 5/2006 | Sano et al. |
| 2007/0170434 A1* | 7/2007 | Inoue et al. ............ 257/72 |
| 2009/0267064 A1 | 10/2009 | Yano et al. |
| 2010/0155717 A1* | 6/2010 | Yano et al. ............ 257/43 |
| 2010/0276683 A1* | 11/2010 | Kim et al. ............ 257/43 |

FOREIGN PATENT DOCUMENTS

| | | | |
|---|---|---|---|
| JP | 11-297478 | * | 10/1999 |
| JP | 2000-44236 A | | 2/2000 |
| JP | 2003-86808 A | | 3/2003 |
| JP | 2006-165529 A | | 6/2006 |
| JP | 2007-73312 A | | 3/2007 |
| JP | 2007-73701 A | | 3/2007 |
| JP | 2007-142195 A | | 6/2007 |
| JP | 2007-142196 A | | 6/2007 |
| JP | 2007-212699 A | | 8/2007 |

OTHER PUBLICATIONS

K. Tominaga et al., "Amorphous Transparent Conductive Oxide Films of In2O3-ZnO with Additional Al2O3 Impurities," Journal of Vacuum Science & Technology A, vol. 23, No. 3 (May/Jun. 2005) pp. 401-407.

C. J. Kim et al. "Highly Stable Ga2O3-In2O3-ZnO TFT for Active-Matrix Organic Light-Emitting Diode Display Application," 2006 International Electron Devices Meeting, vol. 1 of 2 (Dec. 11-13, 2006) pp. 41-44.

Office Action for Chinese Patent Application No. 2008 80122558 dated Sep. 26, 2011.

* cited by examiner

OXIDE SEMICONDUCTOR FIELD EFFECT TRANSISTOR AND METHOD FOR MANUFACTURING THE SAME

This application is a 371 of PCT/JP2008/073252, filed Dec. 19, 2008.

TECHNICAL FIELD

The invention relates to a field effect transistor using an oxide semiconductor film as a channel layer and a method for producing the same.

A field effect transistor such as a thin film transistor (TFT) is widely used as a unit electronic element of a semiconductor memory integrated circuit, a high-frequency signal amplification element, a liquid crystal driving element or the like. It is an electronic device which is most practically used recently.

Of these, with a remarkable development of displays in recent years, a TFT is widely used as a switching element which serves to drive a display by applying a driving voltage to a display element in various displays such as liquid crystal displays (LCD), electroluminescence displays (EL) and field emission displays (FED).

As the material for a semiconductor layer (channel layer) which is the primary element of a field effect transistor, silicon semiconductor compounds are most widely used. In general, a silicon single crystal is used in a high-frequency amplification element, an integrated circuit element or the like which require high-speed operation. On the other hand, in a liquid crystal driving element or the like, an amorphous silicon semiconductor (amorphous silicon) is used in order to meet the demand for an increase in area.

As examples of a TFT, an inverted-staggered TFT can be given in which a gate electrode, a gate-insulating layer, a semiconductor layer such as hydrogenated amorphous silicon (a-Si:H), source and drain electrodes are stacked on a substrate such as glass. This TFT is used, in a field of large-area devices including an image sensor, as a driving element for flat panel displays represented by active matrix-type liquid crystal displays. In these applications, with an improvement in function, an increase in operation speed is demanded even for conventional TFTs using amorphous silicon.

Today, as a switching element for driving a display, a device using a silicon-based semiconductor constitutes the mainstream due to various excellent performances including improved stability and processability of a silicon thin film and a high switching speed. Such a silicon-based thin film is generally produced by the chemical vapor deposition (CVD) method.

Meanwhile, a crystalline silicon-based thin film is required to be heated at a high temperature, for example, 800° C. or higher, for crystallization. Therefore, it is difficult to form a crystalline silicon-based thin film on a glass substrate or on a substrate formed of an organic substance. Accordingly, a crystalline silicon-based thin film can be formed only on an expensive substrate having a high thermal resistance such as silicon wafer and quartz. In addition, it has a problem that a large amount of energy and a large number of steps are required in production.

Further, since the application of a crystalline silicon-based thin film is normally restricted to a TFT with a top-gate configuration, a reduction in production cost such as a decrease in number of masks is difficult.

On the other hand, an amorphous silicon thin film, which can be formed at a relatively low temperature, has a lower switching speed as compared with a crystalline silicon semiconductor. Therefore, when used as a switching element for driving a display, a high-speed animation may not be displayed.

Further, when a semiconductor active layer is irradiated with visible rays, it exhibits conductivity, and performance as a switching element may be deteriorated such as malfunction caused by current leakage. Therefore, a method is known to provide a light-shielding layer to shield visible rays. As the light-shielding layer, a thin metal film is known, for example.

However, if a light-shielding layer formed of a thin metal film is provided, not only the production steps are increased but also a problem arises that, due to a floating potential, the light-shielding layer is required to be fixed to ground level, which results in generation of parasitic capacitance.

Specifically, in the case of a liquid crystal display television having a resolution of VGA, amorphous silicon having a mobility of 0.5 to 1 $cm^2/Vs$ may be used. For a liquid crystal display television having a resolution of SXGA, UXGA, QXGA or higher, a mobility of 2 $cm^2/Vs$ or higher is required. A further higher mobility is required if the driving frequency is increased in order to improve the image quality.

If amorphous silicon, of which the properties change by a DC stress, is used in an organic EL display which is driven by current, a problem occurred that image quality deteriorated if used for a long period of time.

In addition, if crystalline silicon is used in these applications, a demand for an increase in area could not be satisfied or the production cost increased since a high-temperature heat treatment was required.

Under such circumstances, in recent years, as a film which is more improved in stability than a silicon-based semiconductor thin film, an oxide semiconductor thin film using an oxide has attracted attention.

For example, Patent Document 1 discloses a TFT using zinc oxide as the semiconductor layer.

However, this semiconductor layer has a field effect mobility of as low as about 1 $cm^2/Vs$ sec and a small on-off ratio. In addition, since current leakage tends to occur easily, practical application thereof on the industrial scale was difficult. Further, many studies have been made on an oxide semiconductor obtained by using zinc oxide which contains crystalline substances. If this oxide semiconductor is formed into a film by a sputtering method which is generally conducted on the industrial scale, the following problems occurred.

That is, a TFT may have deteriorated performance such as a low mobility, a small on-off ratio, a large amount of current leakage, unclear pinch-off and tendency of becoming normally-on. In addition, since this oxide semiconductor has poor chemicals resistance, the production process or the use environment was limited such as difficulty in wet etching. Further, in order to improve the performance, film formation was required to be conducted at a higher pressure, which caused industrial application to be difficult due to a lower film-forming speed and a higher treatment temperature exceeding 700° C. Further, TFT performance such as field mobility in a bottom-gate configuration was poor. In order to improve the performance, the film thickness was required to be 50 nm or more in a top-gate configuration, which restricted the TFT device structure.

In order to solve these problems, a method has been studied in which an amorphous oxide semiconductor film comprising indium oxide and zinc oxide is prepared to drive a thin film transistor (Patent Document 2). However, this transistor has insufficient performance. Further, in a thin film transistor using this oxide semiconductor film, in order to keep the S value small or to decrease a shift in threshold value cased by a stress, it is necessary to apply a corresponding thermal history (for example, a heat treatment at a temperature higher than 300° C. for 1 hour or more or the like) (Non-Patent Document 1). Therefore, in addition to problems such as a low mobility and a large S value, it is required to use a substrate having a high thermal resistance when such a transistor is used as a TFT of liquid crystal displays, organic EL displays and the like. Accordingly, it was difficult to reduce the cost by using an inexpensive glass substrate or to apply a flexible display using a resin substrate on the industrial scale.

Further, studies have been made on a method in which an amorphous oxide semiconductor film comprising indium oxide, zinc oxide and gallium oxide is formed and a thin film transistor is driven by using this film (Patent Documents 3 and 4). However, in this method, since it is difficult to decrease the resistance of a target or to increase the density of a target, a target is broken easily and a DC sputtering method is difficult to be applied. Detailed studies were made on a semiconductor layer containing a large amount of gallium, and no studies were made on a target containing aluminum. Conventional semiconductor layers containing gallium in a large amount have a large S value, a low thermal resistance and a large shift in threshold value by stress.

A composite oxide containing indium, zinc and elements such as aluminum has been studied as a transparent conductive film (see Patent Document 5 and Non-Patent Document 2). However, this composite oxide has a carrier density which is too high to be used as a transistor.

Patent Document 1: JP-A-2003-86808
Patent Document 2: US2005/0199959
Patent Document 3: JP-A-2007-73701
Patent Document 4: JP-A-2007-73312
Patent Document 5: JP-A-2000-44236
Non-Patent Document 1: Kim, Chang Jung et al. Highly Stable Ga2O3-In2O3-ZnO TFT for Active-Matrix Organic Light-Emitting Diode Display Application, Electron Devices Meetings, 2006. IEDM '06. International (ISBN: 1-4244-0439-8)
Non-Patent Document 2: K. Tomonaga et al., J. Vac. Sci. Technol. A23(3), 2005, 401

DISCLOSURE OF THE INVENTION

The invention has been made in view of the above-mentioned circumstances, and an object thereof is to provide a field effect transistor having a high mobility and a low S value.

Another object of the invention is to provide a method for producing a field effect transistor which can exhibit excellent performance by application of a thermal history at a low temperature or for a short period of time.

According to the invention, the following field effect transistor or the like are provided.

A field effect transistor comprising a semiconductor layer comprising a composite oxide which comprises In, Zn, and one or more elements X selected from the group consisting of Zr, Hf, Ge, Si, Ti, Mn, W, Mo, V, Cu, Ni, Co, Fe, Cr, Nb, Al, B, Sc, Y and lanthanoids (La, Ce, Pr, Nd, Sm, Eu, Gd, Tb, Dy, Ho, Er, Tm, Yb and Lu) in the following atomic ratios (1) to (3):

$$In/(In+Zn)=0.2 \text{ to } 0.8 \quad (1)$$

$$In/(In+X)=0.29 \text{ to } 0.99 \quad (2)$$

$$Zn/(X+Zn)=0.29 \text{ to } 0.99 \quad (3).$$

The invention can be divided into the following two aspects according to the type of the element X.

First Aspect of the Invention

1. A field effect transistor comprising a semiconductor layer comprising a composite oxide which comprises In (indium), Zn (zinc), and one or more elements X selected from the group consisting of Zr, Hf, Ge, Si, Ti, Mn, W, Mo, V, Cu, Ni, Co, Fe, Cr and Nb in the following atomic ratios (1) to (3):

$$In/(In+Zn)=0.2 \text{ to } 0.8 \quad (1)$$

$$In/(In+X)=0.29 \text{ to } 0.99 \quad (2)$$

$$Zn/(X+Zn)=0.29 \text{ to } 0.99 \quad (3).$$

2. The field effect transistor according to 1, wherein the element X is Zr.
3. The field effect transistor according to 1 or 2, wherein the semiconductor layer is amorphous and has an electron carrier concentration of $10^{13}$ to $10^{18}/cm^3$ and a band gap of 2.0 to 6.0 eV.
4. The field effect transistor according to any one of 1 to 3, wherein the semiconductor layer is a non-degenerative semiconductor.
5. A target for a semiconductor layer comprising a composite oxide which comprises In (indium), Zn (zinc), and one or more elements X selected from the group consisting of Zr, Hf, Ge, Si, Ti, Mn, W, Mo, V, Cu, Ni, Co, Fe, Cr and Nb in the following atomic ratios (1) to (3):

$$In/(In+Zn)=0.2 \text{ to } 0.8 \quad (1)$$

$$In/(In+X)=0.29 \text{ to } 0.99 \quad (2)$$

$$Zn/(X+Zn)=0.29 \text{ to } 0.99 \quad (3).$$

6. A method for producing a field effect transistor comprising the steps of forming a semiconductor layer by DC or AC sputtering by using the target according to 5 and subjecting the semiconductor layer to a heat treatment at 70 to 350° C.

Second Aspect of the Invention

1. A field effect transistor comprising a semiconductor layer comprising a composite oxide which comprises In (indium), Zn (zinc), and one or more elements X selected from the group consisting of Al (aluminum), B (boron), Sc (scandium), Y (yttrium) and lanthanoids (La, Ce, Pr, Nd, Sm, Eu, Gd, Tb, Dy, Ho, Er, Trn, Yb and Lu) in the following atomic ratios (1) to (3):

$$In/(In+Zn)=0.2 \text{ to } 0.8 \quad (1)$$

$$In/(In+X)=0.29 \text{ to } 0.99 \quad (2)$$

$$Zn/(X+Zn)=0.29 \text{ to } 0.99 \quad (3).$$

2. The field effect transistor according to 1, wherein the semiconductor layer comprising a composite oxide comprises the element X in the following atomic ratio (2)':

$$In/(In+X)=0.59 \text{ to } 0.99 \quad (2)'.$$

3. The field effect transistor according to 1 or 2, wherein the element X is Al or B.
4. The field effect transistor according to 1 or 2, wherein the element X is Sc or Y.
5. The field effect transistor according to 1 or 2, wherein the element X is a lanthanoid (La, Ce, Pr, Nd, Sm, Eu, Gd, Tb, Dy, Ho, Er, Tm, Yb or Lu).
6. The field effect transistor according to any one of 1 to 5, wherein the semiconductor layer is an amorphous film which has an electron carrier concentration of $10^{13}$ to $10^{18}$/cm$^3$ and a band gap of 2.0 to 6.0 eV.
7. A field effect transistor according to any one of 1 to 6, wherein the semiconductor layer is a non-degenerate semiconductor.
8. A target for a semiconductor layer comprising a composite oxide which comprises In (indium), Zn (zinc), and one or more elements X selected from the group consisting of Al (aluminum), B (boron), Sc (scandium), Y (yttrium) and lanthanoids (La, Ce, Pr, Nd, Sm, Eu, Gd, Tb, Dy, Ho, Er, Tm, Yb and Lu) in the following atomic ratios (1) to (3):

$$In/(In+Zn)=0.2 \text{ to } 0.8 \tag{1}$$

$$In/(In+X)=0.29 \text{ to } 0.99 \tag{2}$$

$$Zn/(X+Zn)=0.29 \text{ to } 0.99 \tag{3}$$

9. The target for a semiconductor layer according to 8, which further comprises one or more elements selected from the group consisting of Sn (tin), Ge (germanium), Si (silicon), Ti (titanium), Zr (zirconium) and Hf (hafnium) in an amount of 100 to 10000 atomic ppm.
10. A method for producing a field effect transistor comprising the steps of forming a semiconductor layer by DC or AC sputtering by using the target according to 8 or 9 and subjecting the semiconductor layer to a heat treatment at 70 to 350° C.

According to the invention, it is possible to obtain a field effect transistor having a high mobility and a small S value. Further, according to the invention, a field effect transistor can be produced by application of a thermal history at a low temperature or for a short period of time.

BEST MODE FOR CARRYING OUT THE INVENTION

First Aspect of the Invention

Figure 1:
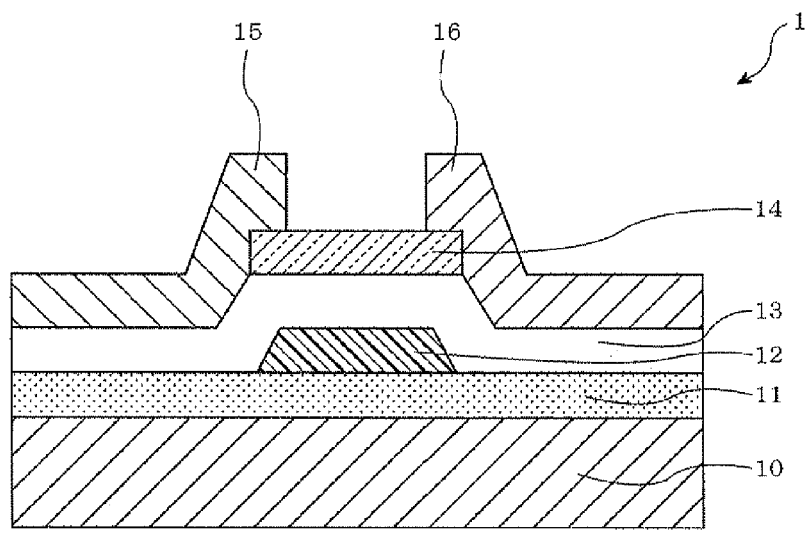
FIG. 1 is a schematic cross-sectional view of a field effect transistor according to one embodiment of the invention.

The field effect transistor of the invention has a semiconductor layer comprising a composite oxide which comprises In (indium), Zn (zinc), and one or more elements X selected from the following group in the following atomic ratios (1) to (3):

Group: Zr, Hf, Ge, Si, Ti, Mn, W, Mo, V, Cu, Ni, Co, Fe, Cr and Nb $$In/(In+Zn)=0.2 \text{ to } 0.8 \tag{1}$$

$$In/(In+X)=0.29 \text{ to } 0.99 \tag{2}$$

$$Zn/(X+Zn)=0.29 \text{ to } 0.99 \tag{3}$$

By allowing the semiconductor layer to be formed of the above-mentioned composite oxide, a field effect transistor having a high mobility and a low S value can be obtained. In addition, a field effect transistor which can exhibit excellent properties by application of a thermal history (heat treatment) at a low temperature or for a short period of time can be obtained.

In the above-mentioned formula (1), if the ratio of In is smaller than 0.2, the mobility may be lowered, the S value may be increased, the moisture proof may be lowered and resistance to chemicals such as an acid, an alkali or the like may be lowered. If the ratio of In is larger than 0.8, the off current or the gate leakage current may become large, the S value may become large, the plasma resistance may be lowered and the threshold value may become negative to cause the transistor to be normally-on.

The In/(In+Zn) is preferably 0.3 to 0.75, more preferably 0.35 to 0.7.

In the above-mentioned formula (2), if the ratio of In is smaller than 0.29, the mobility may be lowered, the S value may be increased and the threshold voltage may be increased. If the ratio of In is larger than 0.99, the off current or the gate leakage current may become large, the threshold value may become negative to cause the transistor to be normally-on, the photocurrent may be increased, the plasma resistance may be lowered and a shift in threshold voltage may be increased.

The In/(In+X) is preferably 0.45 to 0.98, more preferably 0.65 to 0.98, with 0.7 to 0.97 being particularly preferable.

In the above-mentioned formula (3), if the ratio of Zn is smaller than 0.29, the mobility may be lowered, the S value may be increased, a high-temperature or a long-time heat treatment may be required for stabilization or the wet etching rate may be slow. If the ratio is larger than 0.99, the mobility may be lowered, the stability or resistance to heat may be lowered, the moisture proof may be lowered, the resistance to chemicals such as an acid and an alkali may be lowered and a shift in threshold voltage may be increased.

The Zn/(X+Zn) is preferably 0.45 to 0.98, more preferably 0.6 to 0.98, with 0.7 to 0.97 being particularly preferable.

In the invention, it is further preferred that the semiconductor layer satisfy the ratio (atomic ratio) shown by the following formula (4):

$$X/(In+Zn+X)=0.01 \text{ to } 0.2 \tag{4}$$

In the above-mentioned formula (4), if the ratio of X is larger than 0.2, the S value may be increased, the mobility may be lowered or the threshold voltage may be increased. If the ratio of X is smaller than 0.01, the stability or resistance to heat may be lowered, the moisture proof may be lowered, the resistance to chemicals such as an acid and an alkali may be lowered and a shift in threshold voltage may be increased.

The X/(In+Zn+X) is more preferably 0.02 to 0.15, with 0.03 to 0.1 being particularly preferable.

Further, according to applications, it is particularly preferable if the semiconductor layer satisfies the ratio (atomic ratio) shown by the following formula (5) or the following formula (6):

$$In/(In+Zn+X)=0.3 \text{ to } 0.5 \tag{5}$$

$$In/(In+Zn+X)=0.5 \text{ to } 0.7 (0.5 \text{ is not included}) \tag{6}$$

With the above-mentioned ratio (5), the off current may be decreased easily and the on-off ratio can be increased. In addition, film forming conditions or post treatment conditions can be set more freely. With the above-mentioned ratio (6), it is possible to increase the mobility and to decrease the threshold voltage.

In the invention, since the thermal stability and resistance to heat and the chemicals resistance can be improved and the S value or the off current can be decreased, it is preferred that the element X be Zr or Hf, with Zr being particularly preferable.

If the photocurrent is desired to be decreased, the element X is preferably Zr, Hf, Ge, Si or Ti. If the plasma resistance is required to be high to suppress changes in properties in post treatments, it is preferred that the element X be Cu, Ni, Co, Fe, Cr, Mn, W, Mo, V or Nb.

Second Aspect of the Invention

The field effect transistor of the invention has a semiconductor layer comprising a composite oxide which comprises In (indium), Zn (zinc), and one or more elements X selected from the following group A in the following atomic ratios (1) to (3):
Group A: Al (aluminum), B (boron), Sc (Scandium), Y (yttrium) and lanthanoids (La, Ce, Pr, Nd, Sm, Eu, Gd, Tb, Dy, Ho, Er, Tm, Yb and Lu)

$$In/(In+Zn)=0.2 \text{ to } 0.8 \tag{1}$$

$$In/(In+X)=0.29 \text{ to } 0.99 \tag{2}$$

$$Zn/(X+Zn)=0.29 \text{ to } 0.99 \tag{3}$$

By allowing the semiconductor layer to be formed of the above-mentioned composite oxide, a field effect transistor having a high mobility and a low S value can be obtained. In addition, a field effect transistor which can exhibit excellent properties even if the transistor has only thermal history (heat treatment) at a low temperature or for a short period of time.

In the above-mentioned formula (1), if the ratio of In is smaller than 0.2, the mobility may be lowered, the S value may be increased, the moisture proof may be lowered and the resistance to chemicals such as an acid, an alkali or the like may be lowered. If the ratio of In is larger than 0.8, the off current or the gate leakage current may become large, the S value may be large, the plasma resistance may be lowered, and the threshold value may become negative to cause the transistor to be normally-on.

The In/(In+Zn) is preferably 0.3 to 0.75, more preferably 0.35 to 0.7.

In the above-mentioned formula (2), if the ratio of In is smaller than 0.29, the mobility may be lowered, the S value may be increased and the threshold voltage may be increased. If the ratio of In is larger than 0.99, the off current or the gate leakage current may become large, the threshold value may become negative to cause the transistor to be normally-on, the photocurrent may be increased, the plasma resistance may be lowered and a shift in threshold voltage may be increased.

The In/(In+X) is normally 0.29 to 0.99, preferably 0.59 to 0.98, more preferably 0.6 to 0.97, further preferably 0.65 to 0.96, with 0.7 to 0.95 being particularly preferable.

In the above-mentioned formula (3), if the ratio of Zn is smaller than 0.29, the mobility may be lowered, the S value may be increased, a high-temperature or a long-time heat treatment may be required for stabilization or the wet etching rate may be slow. If the ratio is larger than 0.99, the mobility may be lowered, the S value may increase, the stability or resistance to heat may be lowered, the moisture proof may be lowered, the resistance to chemicals such as an acid and an alkali may be lowered and a shift in threshold voltage may be increased.

The Zn/(X+Zn) is preferably 0.45 to 0.98, more preferably 0.6 to 0.98, further preferably 0.7 to 0.97, with 0.75 to 0.90 being particularly preferable.

In the invention, it is further preferred that the semiconductor layer satisfy the ratio (atomic ratio) shown by the following formula (4):

$$X/(In+Zn+X)=0.02 \text{ to } 0.3 \tag{4}$$

If the ratio of X is larger than 0.3, the S value may be increased, the mobility may be lowered or the threshold voltage may be increased. If the ratio of X is smaller than 0.02, the stability or resistance to heat may be lowered, the moisture proof may be lowered, the resistance to chemicals such as an acid and an alkali may be lowered, the off current may be increased and a shift in threshold voltage may be increased.

The X/(In+Zn+X) is more preferably 0.04 to 0.25, further preferably 0.055 to 0.2, with 0.06 to 0.15 being particularly preferable.

In order to realize a proper use according to need, it is particularly preferable if the semiconductor layer satisfies the ratio (atomic ratio) shown by the following formula (5) or the following formula (6):

$$In/(In+Zn+X)=0.3 \text{ to } 0.5 \tag{5}$$

$$In/(In+Zn+X)=0.5 \text{ to } 0.7 (0.5 \text{ is not included}) \tag{6}$$

With the above-mentioned ratio (5), the off current may be decreased easily and the on-off ratio can be increased. In addition, film forming conditions or post treatment conditions can be set more freely. With the above-mentioned ratio (6), it is possible to increase the mobility and to decrease the threshold voltage.

In the invention, the element X is preferably Al or B. Also it is preferred that the element X be Sc or Y. Further, it is preferred that the element X be a lanthanoid (La, Ce, Pr, Nd, Sm, Eu, Gd, Tb, Dy, Ho, Er, Tm, Yb or Lu).

There are no particular restrictions on other configurations of the field effect transistor of the invention as far as it has the semiconductor layer shown in the first and second aspects as mentioned above. The field effect transistor of the invention may have a known structure such as a top-gate configuration and a bottom-gate configuration. The configuration example of the field effect transistor will be explained with reference to the drawings.

FIG. 1 is a schematic cross-sectional view of a field effect transistor according to one embodiment of the invention.

In the field effect transistor 1 has a bottom-gate type configuration in which a gate electrode 12 is formed in a striped pattern on a silicon substrate 10 having a thermally oxidized film 11. A gate insulating film 13 is formed so as to cover the gate electrode 12, and a semiconductor layer 14 (active layer) is formed on this gate insulating film 13 above the gate electrode 12.

To one end 14a of the semiconductor layer 14, a source electrode 15 is connected in a direction orthogonally crossing the gate electrode 12. To the other end 14b of the semiconductor layer 14, which is opposing to the one end 14a, a drain electrode 16 is connected.

Figure 2:
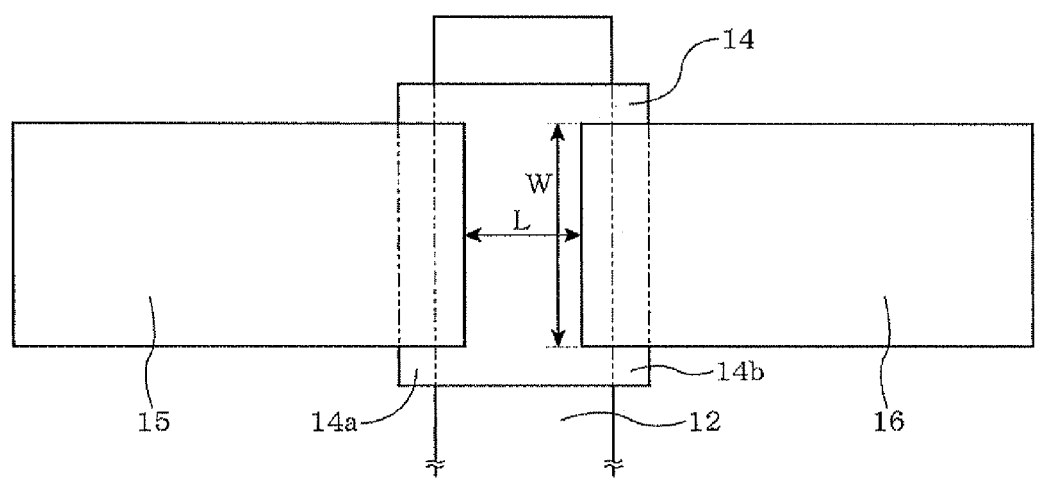
FIG. 2 is a schematic top view of the field effect transistor 1.

FIG. 2 is a schematic top view showing the positional relationship of the gate electrode 12, the semiconductor layer 14, the source electrode 15 and the drain electrode 16. In order to allow the positional relationship to be visible, part of constituting elements are not shown.

In the case of a bottom-gate type field effect transistor, it is preferred that the semiconductor layer be covered by a protective layer. In a bottom-gate transistor, main parts of the semiconductor layer are exposed without the protective layer. Accordingly, the effects of providing the protective layer are significant.

Figure 3:
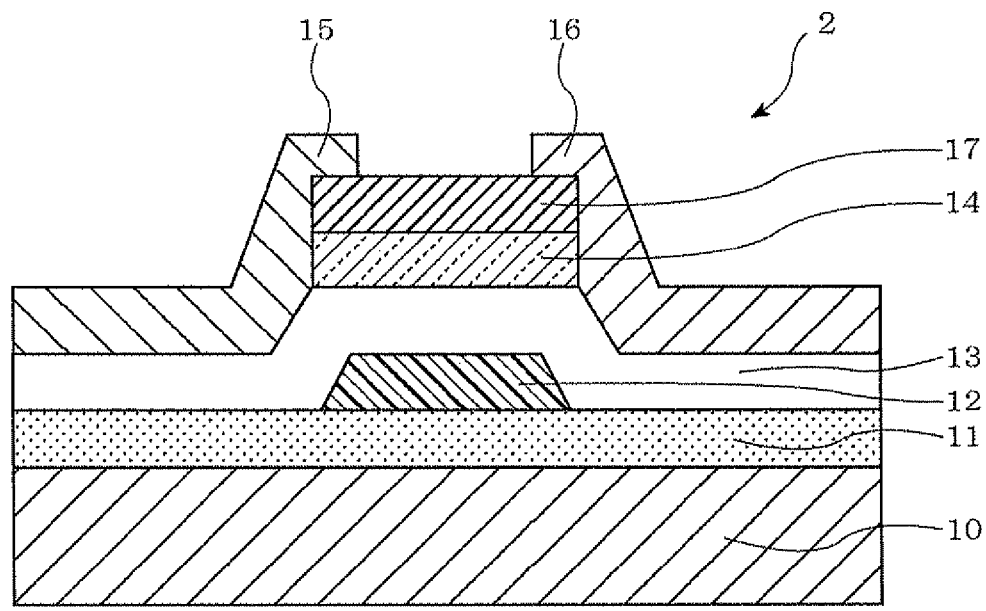
FIG. 3 is a schematic cross-sectional view according to another embodiment of the invention.
Figure 4:
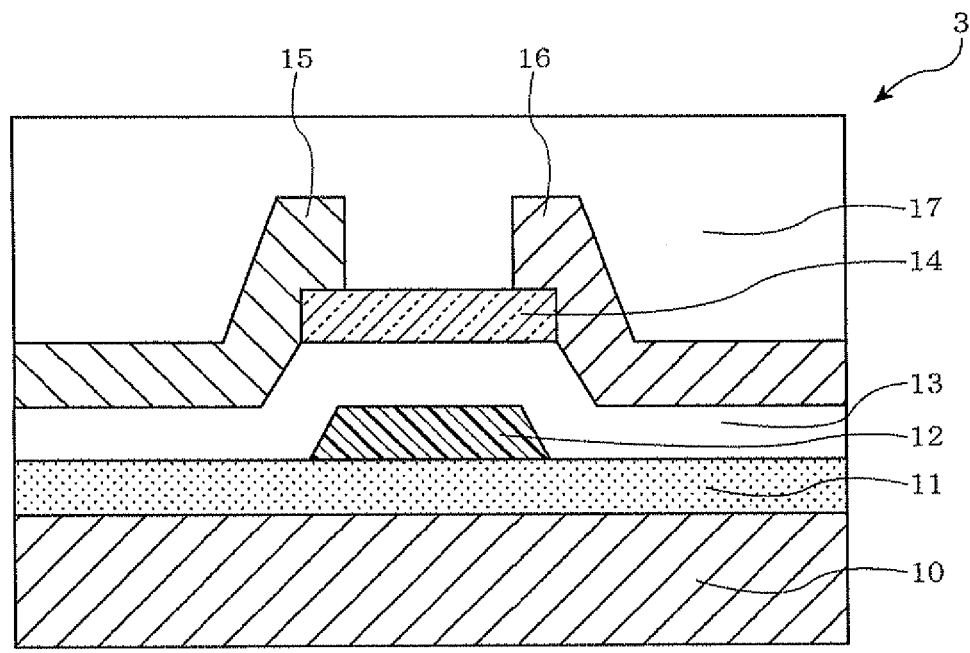
FIG. 4 is a schematic cross-sectional view according to another embodiment of the invention.

FIG. 3 and FIG. 4 are schematic cross-sectional views of a field effect transistor according to another embodiment of the invention.

Except for the provision of the protective layer 17, the field effect transistors 2 and 3 have the same configurations as that of the above-mentioned field effect transistor 1.

Figure 5:
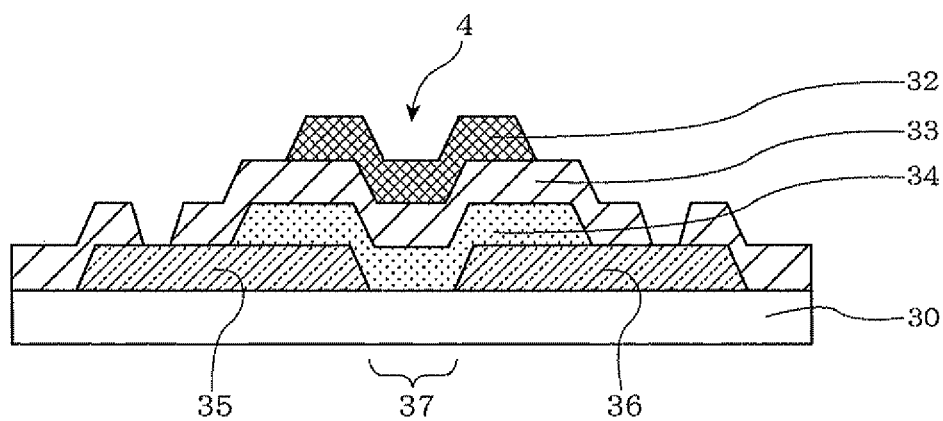
FIG. 5 is a schematic cross-sectional view of a field effect transistor according to another embodiment of the invention.

FIG. 5 is a schematic cross-sectional view of a top-gate field effect transistor.

In the field effect transistor 4, a source electrode 35 and a drain electrode 36 are formed on a substrate 30. A semiconductor layer 34 is provided so as to cover the gap between the electrodes and part of these electrodes. A gate electrode 32 is formed above the semiconductor layer 34 with a gate insulating film 33 therebetween.

In the transistor 3, the substrate 30 serves as a protective layer 37.

Each constituting element of the field effect transistor will be explained below.

1. Substrate

There are no particular restrictions, and known substrates in the art can be used. For example, glass substrates such as alkali silicate glass, non-alkali glass and quartz glass, silicon substrates, resin substrates such as acryl, polycarbonate and polyethylene naphthalate (PEN) and high-molecular film bases such as polyethylene terephthalate (PET) and polyamides.

The thickness of the substrate or the base is normally 0.1 to 10 mm, preferably 0.3 to 5 mm. In the case of a glass substrate, it is preferable to use a glass substrate which is chemically or thermally reinforced.

If transparency or smoothness is required, a glass substrate and a resin substrate are preferable, with a glass substrate being particularly preferable. If a substrate is required to be light in weight, it is preferable to use a resin substrate or a high-molecular base.

2. Semiconductor Layer

The semiconductor layer is formed of a composite oxide which comprises In (indium), Zn (zinc) and the element X in the ratios (1) to (3), preferably (1) to (4), shown in the first or second aspect mentioned above.

Such a semiconductor layer can be prepared by forming a thin film by using the composite oxide target (target for a semiconductor) of the invention.

The semiconductor target of the invention comprises a sintered body of a composite oxide shown in the first or second aspect which satisfies the ratios (1) to (3) or (1) to (4). The target is formed of powder mixture as a raw material containing indium oxide, zinc oxide and an oxide of the element X in such an amount that satisfies the above-mentioned element ratio, for example. The target can be prepared by pulverizing the raw material powder by means of a ball mill or the like, molding into a target-like form, followed by firing.

Part of the raw material powder used may be one which is prepared from a scrap containing high-purity indium oxide such as remaining target materials or used targets. In particular, indium oxide collected from an ITO target is preferable since it contains an appropriate amount of Sn (tin) as impurities. Collection of indium oxide can be conducted by a known method such as one disclosed in JP-A-2002-069544.

A target with excellent appearance and a high transverse rupture strength can be obtained easily when the element X shown in the above-mentioned first aspect is Zr, Hf, Ge, Si, Ti, V and Nb.

The purity of each raw material powder is normally 99.9% (3N) or more, preferably 99.99% (4N) or more, further preferably 99.995% or more, and particularly preferably 99.999% (5N) or more. If the purity of each raw material powder is less than 99.9% (3N), problems arise that the semiconductor properties may be lowered due to impurities, appearance may be deteriorated such as generation of unevenness in color or dots, reliability may be lowered or the like.

As for the raw material powder, it is preferred that the specific surface area of indium oxide powder be 8 to 10 $m^2/g$, the specific surface area of zinc oxide powder be 2 to 4 $m^2/g$ and the specific surface area of an oxide of the element X be 5 to 10 $m^2/g$ (more preferably 8 to 10 $m^2/g$). It is preferred that the median diameter of indium oxide powder be 0.2 to 2 μm and the median diameter of zinc oxide powder be 0.8 to 1.6 μm.

It is preferable to use powder in which the specific surface area of indium oxide powder and the specific surface area of an oxide powder of the element X be almost the same. In this way, pulverizing and mixing can be conducted more efficiently. Specifically, it is preferred that the difference in specific surface area be 5 $m^2/g$ or less. If the difference in specific surface area is too large, efficient pulverizing and mixing cannot be conducted, and particles of an oxide of the element X may remain in a sintered body.

The powder mixture is pulverized and mixed by means of a wet medium stirring mill. At this time, it is preferable to conduct pulverization such that the specific surface area after the pulverization be increased in an amount of 1.5 to 2.5 $m^2/g$ as compared with the specific surface area of the raw material powder, or such that the average median diameter after the pulverization become 0.6 to 1 μm. By using the raw material powder which has been adjusted in this way, it is possible to obtain a high-density oxide sintered body without the need of pre-firing process. A reduction process will also be unnecessary.

If an increase in specific surface area of the raw material powder mixture is less than 1.0 $m^2/g$ or the average median diameter of the raw material powder mixture after pulverization exceeds 1 μm, the sintering density may not be sufficiently large. On the other hand, if an increase in specific surface area of the raw material powder mixture exceeds 3.0 $m^2/g$ or if the average median diameter after the pulverization is less than 0.6 μm, the amount of contaminants (the amount of impurities which have been mixed in) from a pulverizer or the like during the pulverization may be increased.

Here, the specific surface area of each powder is a value measured by the BET method. The median diameter of each powder is a value measured by a particle size distribution analyzer. These values can be adjusted by pulverizing powder by a dry pulverization method, a wet pulverization method or the like.

The raw material after the pulverization is molded after drying by means of a spray dryer or the like. For the molding, a known molding method such as pressure molding and cold isostatic molding can be used, for example.

Subsequently, the resulting molded product is sintered to obtain a sintered body. It is preferred that sintering be conducted at 1350 to 1600° C. for 2 to 20 hours. If the sintering temperature is less than 1350° C., the density may not be increased. A sintering temperature exceeding 1600° C. may result in problems that zinc evaporates to cause the composition of the sintered body to vary or voids are generated by evaporation in the sintered body.

As for the sintering, it is preferable to conduct sintering in an oxygen atmosphere by circulating oxygen or conduct sintering under pressure. In this way, evaporation of zinc can be suppressed, whereby a sintered body having no voids can be obtained.

The sintered body produced by the above-mentioned method has a high density, and hence, it can produce an oxide semiconductor film improved in film properties since it generates a less amount of nodules or particles during use.

An oxide sintered body becomes a target by subjecting it to a processing such as polishing. Specifically, for example, a sintered body is ground by means of a surface grinder to allow it to have a surface roughness Ra of 5 μm or less. Further, the sputtering surface of the target is subjected to mirror polishing to allow an average surface roughness Ra to be 1000 Å or less. This mirror polishing can be conducted by a known polishing technology such as mechanical polishing, chemical polishing and mechanochemical polishing (combination of mechanical polishing and chemical polishing). For example, polishing may be conducted a roughness of #2000 or more by using a fixed abrasive polisher (polishing solution: water), or, polishing may be conducted by lapping by means of a free abrasive lap (abrasive: SIC paste or the like) and then lapping by using diamond paste instead of the abrasive. There are no particular restrictions on such polishing method.

By bonding to a backing plate, the resulting sputtering target can be installed in various film-forming apparatuses. As examples of the film-forming method, the sputtering method, the PLD (pulse laser deposition) method, the vacuum vapor deposition method, the ion plating method or the like can be given.

For cleaning the target, air blowing, washing with running water or the like can be used. If removal of foreign matters is performed by air blowing, foreign matters can be effectively removed by absorbing the air by means of a dust collector facing the nozzle.

In addition to air blowing or washing with running water, it is possible to conduct ultrasonic cleaning or the like. In the ultrasonic cleaning, it is effective to conduct the ultrasonic cleaning by generating multiple oscillation within a frequency of 25 to 300 KHz. For example, ultrasonic cleaning may be performed by generating multiple oscillation of 12 kinds of frequencies of from 25 to 300 KHz every 25 KHz.

The particle size of each compound in the oxide sintered body is preferably 20 μm or less, further preferably 10 μm or less, and particularly preferably 5 μm or less. The particle size is an average particle size measured by an electron probe micro-analyzer (EPMA). The particle size of the crystal is obtained by adjusting, for example, the amount ratio of each powder of indium oxide, an oxide of the element X and zinc oxide as raw materials or the particle size, the purity, the heating time, the sintering temperature, the sintering time, the sintering atmosphere and the cooling time of the raw material powder, If the particle size of the compound is larger than 20 μm, nodules may be generated during sputtering.

It is preferred that the density of the target be 95% or more, more preferably 98% or more, and particularly preferably 99% or more of the theoretical density. If the density of the target is smaller than 95%, the target may be broken due to insufficient strength during film formation. Further, the performance may be un-uniform when a transistor is prepared.

Here, the theoretical relative density of the target is measured by the following method. That is, the density is calculated from the specific gravity of each oxide and the amount ratio of oxides (for example, ZnO is 5.66 g/cm$^3$, In$_2$O$_3$ is 7.12 g/cm$^3$, ZrO$_2$ is 5.98 g/cm$^3$), the ratio of the density thus obtained with a density obtained by the Archimedian method is calculated to obtain a theoretical relative density.

It is preferred that the bulk resistance of the target be preferably 20 mΩ or less, more preferably 10 mΩ or less, further preferably 5 mΩ or less, and particularly preferably 2 mΩcm or less. If the bulk resistance is larger than 20 mΩ, the target may be damaged during film formation by sputtering. Furthermore, spark is generated due to abnormal discharge to cause the target to be cracked or the properties of the resulting film as an oxide semiconductor film may be deteriorated due to the adhesion of particles which have jumped out from the target by the spark to a formed film on a substrate. In addition, the target may be cracked during discharge.

The bulk resistance is a value measured by the four probe method using a resistivity meter.

The transverse rupture strength of the target of the invention is preferably 8 kg/mm$^2$ or more, more preferably 10 kg/mm$^2$ or more, and particularly preferably 12 kg/mm$^2$ or more. For the reason that a load may be applied during transportation and attachment to cause the target to be broken, a target is required to have a transverse rupture strength which is equal to or larger than a predetermined level. If the transverse rupture strength is less than 8 kg/mm$^2$, it may not be used as a target. The transverse rupture strength of a target can be measured according to JIS R 1601.

In the target according to the second aspect of the invention, it is preferred that it contain one or more elements selected from the group consisting of Sn (tin), Ge (germanium), Si (silicon), Ti (titanium), Zr (zirconium) and Hf (hafnium) in an amount of 100 to 10000 ppm. If these elements are contained, effects such as improvement in target density and target strength, lowering in target resistance, reduction in unevenness in color, improvement in uniformity and reduction of abnormal discharge or yellow flakes are brought about, and improvement in quality as a semiconductor target can be expected.

The above-mentioned elements may be contained as impurities by using raw materials which have been collected from a sintered body (target) containing these elements. Further, these elements may be added to raw materials as metal powder and as an oxide.

In the invention, it is preferred that the semiconductor layer be an amorphous film.

If the semiconductor layer is an amorphous film, adhesiveness between an insulating film and a protective layer may be improved or uniform transistor properties can be easily obtained even if the area is large.

Whether the semiconductor film is amorphous or not can be confirmed by an X-ray crystal structure analysis. If a clear peak is not observed, the film is amorphous.

The electron carrier concentration of the semiconductor layer is preferably $10^{13}$ to $10^{18}$/cm$^3$, particularly preferably $10^{14}$ to $10^{17}$/cm$^3$.

If the electron carrier concentration is in the above-mentioned range, the semiconductor layer may be a non-degenerative semiconductor easily, and when used as a transistor, the mobility and the on-off ratio may be well-balanced.

It is preferred that the band gap be 2.0 to 6.0 eV, with 2.8 to 5.0 eV being particularly preferable. If the band gap is smaller than 2.0 eV, the semiconductor layer may absorb visible rays to cause a field effect transistor to malfunction. If the band gap is larger than 6.0 eV, carriers may not be supplied easily, and as a result, a field effect transistor may not function.

It is preferred that the semiconductor layer be a non-degenerative semiconductor showing a thermal activation-type behavior. If the semiconductor layer is a degenerative semiconductor, the off current/gate leakage current may be increased due to an excessive number of carriers, and hence, the threshold value may be negative to allow the transistor to be normally-on.

Whether the semiconductor layer is a non-degenerative semiconductor or not can be judged from the temperature dependency of the mobility and the carrier density measured by using the hall effect.

The semiconductor layer can be a non-degenerative semiconductor by adjusting the partial oxygen pressure during film formation or by adjusting the amount of oxygen deficiency by conducting a post treatment, thereby to optimize the carrier density.

The surface roughness (RMS) of the semiconductor layer is preferably 1 nm or less, further preferably 0.6 nm or less, and particularly preferably 0.3 nm or less. If the surface roughness is larger than 1 nm, the mobility may be lowered.

It is preferred that the semiconductor layer be an amorphous film keeping at least part of the edge-sharing structure of the bixbyite structure of indium oxide. Whether the amorphous film containing indium oxide keeps at least part of the edge-sharing structure of the bixbyite structure of indium oxide can be confirmed by the presence of a peak derived from In—X (X is In, Zn) between 0.30 to 0.36 nm by using a radial distribution function (RDF) obtained by grazing incidence X-ray scattering (GIXS) conducted by using high-luminance synchrotron radiation or the like. For details, reference can be made to the following documents.

F. Utsuno, at al., Thin Solid Films, Volume 496, 2006, Pages 95-98

Furthermore, if the maximum value of RDF with an interatomic distance of 0.30 to 0.36 nm is taken as A and the maximum value of RDF with an interatomic distance of 0.36 to 0.42 is taken as B, it is preferred that the relationship A/B>0.7 be satisfied. The A/B>0.85 is more preferable, A/B>1 is further preferable, with the A/B>1.2 being particularly preferable.

If the A/B is 0.7 or less, when the semiconductor layer is used as the active layer of a transistor, the mobility may be lowered, the threshold value or the S value may be too large. A small NB appears to be caused by a poor short range order of the amorphous film.

It is preferred that the average In—In bonding distance be 0.3 to 0.322 nm, with 0.31 to 0.32 nm being particularly preferable. The average In—In bonding distance can be obtained by an X-ray absorption spectroscopy. In the measurement by an X-ray absorption spectroscopy, an extended X-ray absorption fine structure (EXAFS) extending to an energy higher by several hundreds eV from the rising edge is shown. The EXAFS is caused by backward scattering of electrons by atoms surrounding excited atoms. An interference of a wave of electrons which are jumped out and a wave of electrons which are scattered backwardly occurs. The interference depends on the wavelength in an electron state and the light path in which electrons move to surrounding atoms. A radial distribution function (RDF) can be obtained by Fourier transforming EXAFS. The average bonding distance can be estimated from the peak of RDF.

The thickness of the semiconductor layer is normally 0.5 to 500 nm, preferably 1 to 150 nm, more preferably 3 to 80 nm, and particularly preferably 10 to 60 nm. If the thickness is smaller than 0.5 nm, it is difficult to form a uniform film on the industrial scale. On the other hand, if the thickness of the semiconductor layer is larger than 500 nm, the film forming time is prolonged and the industrial application thereof becomes impossible. In the thickness is within 3 to 80 nm, TFT properties such as mobility and on-off ratio are particularly preferable.

It is preferred that the semiconductor layer be an amorphous film and that the energy width ($E_0$) on the non-localized level of the semiconductor layer be 14 meV or less. It is preferred that the energy width ($E_0$) on the non-localized level is more preferably 10 meV or less, further preferably 8 meV or less, with 6 meV or less being particularly preferable.

If the energy width ($E_0$) on the non-localized level of the semiconductor layer exceeds 14 meV, when the semiconductor layer is used as an active layer of the transistor, the mobility may be lowered or the threshold value and the S value may be too large. A large energy width ($E_0$) on the non-localized level of the semiconductor layer appears to be caused by a poor short range order of the amorphous film.

3. Protective Layer of Semiconductor Layer

In the field effect transistor, it is preferred that the protective layer for the semiconductor be provided. Without a protective layer, oxygen of the surface layer of the semiconductor is removed in vacuum or under a low pressure, and as a result, the off current may be increased or the threshold voltage may become negative. In the air, the transistor is affected by environments such as moisture, whereby variation in transistor properties such as threshold voltage may become large.

There are no particular restrictions on the material for forming the protective layer of the semiconductor. As far as the advantageous effects of the invention are not impaired, materials which are commonly used can be arbitrarily selected. For example, $SiO_2$, SiNx, $Al_2O_3$, $Ta_2O_5$, $TiO_2$, MgO, $ZrO_2$, $CeO_2$, $K_2O$, $Li_2O$, $Na_2O$, $Rb_2O$, $Sc_2O_3$, $Y_2O_3$, $Hf_2O_3$, $CaHfO_3$, $PbTi_3$, $BaTa_2O_6$, $SrTiO_3$, AlN or the like may be used. Of these, $SiO_2$, SiNx, $Al_2O_3$, $Y_2O_3$, $Hf_2O_3$ and $CaHfO_3$ are preferably used, with $SiO_2$, SiNx, $Y_2O_3$, $Hf_2O_3$ and $CaHfO_3$ being more preferable. Oxides such as $SiO_2$, $Y_2O_3$, $Hf_2O_3$ and $CaHfO_3$ are particularly preferable. The oxide number of these oxides may not necessarily coincide with the stoichiometrical ratio (for example, they may be $SiO_2$ or SiOx). SiNx may contain a hydrogen element.

Such a protective film may be a stack structure in which two or more different insulating films are stacked.

The protective layer may be crystalline, polycrystalline or amorphous. It is preferred that the layer be polycrystalline or amorphous since it can be produced easily on the industrial scale. In particular, it is preferred that the protective layer be amorphous. If it is not an amorphous film, the smoothness of an interface is poor, and hence, the mobility may be lowered, the threshold voltage or the S value may be too large.

It is preferred that the protective layer of the semiconductor layer be an amorphous oxide or an amorphous nitride. It is particularly preferable if the protective layer is an amorphous oxide. If the protective layer is not an oxide, oxygen in the semiconductor moves to the protective layer, and as a result, the off current may be increased or the threshold voltage may be negative to cause the transistor to be normally-on.

An organic insulating film such as poly(4-vinylphenol) (PVP) or parylene may be used in the protective layer of the semiconductor layer. Further, the protective layer of the semiconductor layer may have a stack structure in which an inorganic insulating film and an organic insulating film are stacked in two or more.

4. Gate Insulating Film

There are no particular restrictions on the material for forming the gate insulating film. Materials which are commonly used can be selected arbitrarily as long as advantageous effects of the invention of the embodiment are not impaired. For example, $SiO_2$, SiNx, $Al_2O_3$, $Ta_2O_5$, $TiO_2$, MgO, $ZrO_2$, $CeO_2$, $K_2O$, $Li_2O$, $Na_2O$, $Rb_2O$, $Sc_2O_3$, $Y_2O_3$, $Hf_2O_3$, $CaHfO_3$, $PbTi_3$, $BaTa_2O_6$, $SrTiO_3$, AlN or the like may be used. Of these, $SiO_2$, SiNx, $Al_2O_3$, $Y_2O_3$, $Hf_2O_3$ and $CaHfO_3$ are preferably used, with $SiO_2$, SiNx, $Y_2O_3$, $Hf_2O_3$ and $CaHfO_3$ being more preferable. The oxygen number of these oxides may not necessarily coincide with the stoichiometrical ratio (for example, they may be $SiO_2$ or SiOx). SiNx may contain a hydrogen element.

The gate insulating film may be a stack structure in which two or more different insulating films are stacked. The gate insulating film may be crystalline, polycrystalline or amorphous. It is preferred that the gate insulating film be polycrystalline or amorphous since it can be produced easily on the industrial scale.

An organic insulating film such as poly(4-vinylphenol) (PVP) or parylene may be used in the gate insulating film. Further, the gate insulating film may have a stack structure in which an inorganic insulating film and an organic insulating film are stacked in two or more.

5. Electrode

There are no particular restrictions on the material for forming each of the gate electrode, the source electrode and the drain electrode. Materials which are commonly used can be arbitrary used as far as the advantageous effects of the invention are not impaired.

For example, transparent electrodes such as indium tin oxide (ITO), indium zinc oxide, ZnO and $SnO_2$, metal electrodes such as Al, Ag, Cr, Ni, Mo, Au, Ti, Ta and Cu, or metal electrodes of alloys containing these metals can be used. In addition, it is preferable to stack two or more of these layers to decrease contact resistance or to increase interfacial strength. In order to decrease the contact resistance of the source electrode and the drain electrode, the interface between the semiconductor and these electrodes may be subjected to a plasma treatment, an ozone treatment or the like to adjust the resistance.

Next, an explanation is made on the method for producing a field effect transistor of the invention.

The production method of the invention is characterized in that it comprises the steps of forming a semiconductor layer by DC or AC sputtering by using a target of the invention mentioned above and conducting a heat treatment at 70 to 350° C. after the formation of the semiconductor layer.

Each of the constituting elements (layer) of the above-mentioned field effect transistor can be formed by a technique which is known in the art.

Specifically, as the film forming method, chemical film forming methods such as the spray method, the dipping method and the CVD method, or physical film forming methods such as the vacuum vapor deposition method, the ion plating method and the pulse laser deposition method can be used. In respect of easiness in controlling the carrier density and easiness in improving film quality, it is preferable to use a physical film forming method. More preferably, the sputtering method is used due to its high productivity.

In the sputtering, it is possible to use a method in which a sintered target of a composite oxide is used, a method in which co-sputtering is conducted by using a plurality of sintered targets and a method in which reactive sputtering is conducted by using an alloy target. In the method where co-sputtering is conducted by using a plurality of sintered targets or in the method where reactive sputtering is conducted by using an alloy target, problems such as deterioration of uniformity or reproducibility and an increased energy width ($E_0$) on the non-localized level may occur, and as a result, transistor properties such as a lowering in mobility or an increase in threshold voltage may occur. Preferably, a sintered target formed of a composite oxide is used.

The film obtained by the sputtering method can be patterned by various etching methods.

In the invention, the semiconductor layer is formed by DC or AC sputtering by using a target of the invention. By using DC sputtering or AC sputtering, damage during film forming may be suppressed as compared with the case of RF sputtering. Therefore, when used in the field effect transistor, effects such as a reduced shift in threshold voltage, an improved mobility, a decreased threshold voltage and a decreased S value can be expected.

In the invention, after forming the semiconductor layer and the protective layer for the semiconductor, a heat treatment is conducted at 70 to 350° C. If a heat treatment is conducted at a temperature lower than 70° C., the resulting transistor may have a lowered resistance or stability to heat, a decreased mobility, an increased S value or an increased threshold voltage. On the other hand, if a heat treatment is conducted at a temperature higher than 350° C., a substrate having no thermal resistance may not be used, an extra cost for heat treatment equipment may be incurred, the interface of the protective layer, the insulating film or the semiconductor layer may be deteriorated, or an amorphous film may not be obtained since crystallization occurs when a film is formed at a lowered water partial pressure.

The heat treatment temperature is preferably 80 to 260° C., more preferably 90 to 180° C. and particularly preferably 100 to 150° C. A heat treatment temperature of 180° C. or lower is preferable, since a resin substrate having a lower resistance to heat such as PEN can be used.

Although a heat treatment is conducted normally for 1 second to 24 hours, it is preferable to adjust the heat treatment time according to the treatment temperature. For example, at a heat treatment temperature of 70 to 180° C., the heat treatment time is preferably 10 minutes to 24 hours, more preferably 20 minutes to 6 hours, and particularly preferably 30 minutes to 3 hours. At a heat treatment temperature of 180 to 260° C., the heat treatment time is more preferably 6 minutes to 4 hours, further preferably 15 minutes to 2 hours. At a heat treatment temperature of 260 to 300° C., the heat treatment time is more preferably 30 seconds to 4 hours, and particularly preferably 1 minute to 2 hours. At a heat treatment temperature of 300 to 350° C., the heat treatment time is more preferably 1 second to 1 hour, particularly preferably 2 seconds to 30 minutes.

It is preferred that the heat treatment be conducted in an environment where an oxygen partial pressure is $10^{-3}$ Pa or less in an inert gas or be conducted after the semiconductor layer is covered by the protective layer. In the above-mentioned conditions, reproducibility is improved.

As the inert gas, $N_2$, He, Ne, Ar, Kr and Xe are preferable.

The mobility of the field effect transistor of the invention preferably has a mobility of 1 $cm^2$/Vs or more, more preferably 3 $cm^2$/Vs or more and particularly preferably 8 $cm^2$/Vs or more. If the mobility is smaller than 1 $cm^2$/Vs, the switching speed may be too slow to be used in a large-area, high-precision display.

The on-off ratio is preferably $10^6$ or more, more preferably $10^7$ or more and particularly preferably $10^8$ or more.

The off current is preferably 2 pA or less, more preferably 1 pA or less, further preferably 0.5 pA or less, and particularly preferably 0.2 pA or less. If the off current is larger than 2 pA, the contrast may be poor or display uniformity may be deteriorated when used in a TFT of a display.

The gate leakage current is preferably 1 pA or less. If the gate leakage current is larger than 1 pA, the contrast may be deteriorated when used as a TFT of a display.

The threshold voltage is normally 0 to 10 V, preferably 0 to 4 V, more preferably 0 to 3 V and particularly preferably 0 to 2 V. If the threshold voltage is smaller than 0 V, the transistor may become normally-on, and as result, it is required to apply a voltage when the transistor is in the off state, resulting in an increased consumption power. If the threshold voltage is larger than 10 V, the driving voltage is increased, and as a result, the consumption power may be increased or a high mobility may be required.

The S value is preferably 0.8 V/dec or less, more preferably 0.3 V/dec or less, further preferably 0.25 V/dec or less and particularly preferably 0.2 V/dec or less. If the S value is larger than 0.8 V/dec, the driving voltage may be increased, resulting in an increase in consumption power. In particular, when used in an organic EL display which is driven by DC current, it is preferable to suppress the S value to 0.3 V/dec or less since the consumption power can be significantly decreased.

The S value (Swing Factor) is a value indicating the sharpness of the rising of the drain current from the off-state to the on-state when the gate voltage of a transistor is increased from the off-state. Specifically, the S value is defined by the following formula. As defined by the following formula, the S value is an increase in gate voltage when the drain current is increase by one digit (10 times).

$$S\text{value} = dVg/d\log(Ids)$$

A smaller S value means a sharp rising ("Thin Film Transistor Technology", by Ukai Yasuhiro, 2007, published by Kogyo Chosakai Publishing, Inc.)

When the S value is large, a high gate voltage is required to be applied when switching from the on-state to the off-state, which may result in an increased consumption power.

An amount of shift in threshold voltage before and after the application of a 10 μA-DC voltage at 50° C. for 100 hours is preferably 1.0 V or less and more preferably 0.5 V or less. When the shift amount exceeds 1 V, if a transistor is used in an organic EL display, the image quality thereof may be changed.

Further, it is preferred that hysteresis when a gate voltage is increased or decreased in a transmission curve be small.

The ratio (W/L) of the channel width W and the channel length L (see FIG. 2) is normally 0.1 to 100, preferably 0.5 to 20 and particularly preferably 1 to 8. If the W/L exceeds 100, the current leakage may be increased or the on-off ratio may be decreased. If the W/L is smaller than 0.1, the field effect mobility may be lowered or the pinch off may be unclear.

Further, the channel length L is normally 0.1 to 1000 μm, preferably 1 to 100 μm, more preferably 2 to 10 μm. If the channel length is 0.1 μm or less, it is difficult to produce the transistor on the industrial scale, and the current leakage may be increased. A channel length of 1000 μm or more is not preferable since it makes the device too large in size.

It is preferred that the field effect transistor of the invention have a structure capable of shielding the semiconductor layer from light. If it does not have the structure capable of shielding the semiconductor layer from light (for example, a light-shielding layer), when light is entering the semiconductor layer, carrier electrons are exited to increase the off current. It is preferred that the light-shielding layer be a thin film having an absorption at 300 to 800 nm. The light-shielding layer may be provided above or below the semiconductor layer. It is preferred that the light-shielding layer be provided on both above and below the semiconductor layer. The light-shielding layer may be simultaneously used as the gate insulting film, the black matrix or the like. If the light-shielding layer is provided only on one side, it is necessary to contrive the structure to prevent light from irradiating from the side on which no light-shielding layer is provided.

In the field effect transistor of the invention, it is preferable to provide a contact layer between the semiconductor layer and the source electrode or the drain electrode. As the materials for forming the contact layer, composite oxides having a composition similar to that of the semiconductor layer can be used. That is, it is preferred that the contact layer comprise an oxide comprising, as a main component, In or Zn or the like, which are contained in the semiconductor layer. If these elements are not contained, move of elements occurs between the contact layer and the semiconductor layer, the amount of shift in threshold voltage may be increased when a stress test or the like is conducted.

There are no particular restrictions on the method for forming the contact layer. It is possible to form a contact layer having the same composition ratio as that of the semiconductor layer by changing film forming conditions, to form a layer having a composition ratio different from that of the semiconductor layer, to form a contact layer by subjecting a part of the semiconductor which contacts the electrode to a plasma treatment or an ozone treatment to increase the resistance thereof, or to form a layer having a higher resistance by adjusting film forming conditions such as an oxygen partial pressure when forming a semiconductor layer.

In the field effect transistor of the invention, it is preferred that an oxide resistant layer having a higher resistance than that of the semiconductor layer be formed between the semiconductor layer and the gate insulating film and/or between the semiconductor layer and the protective layer. Without the oxide resistant layer, an off current may be generated and the threshold voltage may be negative to cause the transistor to be normally-on. In addition, the semiconductor layer may be denatured to have deteriorated properties during post treatment processes such as the formation of a protective film or etching.

The following can be exemplified as the oxide resistant layer:

- An amorphous oxide film having the same composition as that of the semiconductor layer which is formed at an oxygen partial pressure which is higher than that during the formation of a semiconductor film
- An amorphous oxide film containing the same elements as those of the semiconductor layer, but having a different composition ratio
- An amorphous oxide film containing In, Zn and the element X which is different from that in the semiconductor layer
- A polycrystalline oxide film comprising indium oxide as a main component
- A polycrystalline oxide film comprising indium oxide as a main component which is doped with one or more positive divalent elements such as Zn, Cu, Co, Ni, Mn and Mg
- An amorphous oxide film obtained by adding, to the composition contained in the semiconductor layer, one or more elements selected from Cu, Co, Ni, Mn, Fe, Mg, Ca, Sr, Ba, Ag and Au In the case of an amorphous oxide film containing the same elements as those of the semiconductor layer, but having a different composition ratio, or an amorphous oxide film containing In, Zn and the element X which is different from that in the semiconductor layer, it is preferred that the In composition ratio be smaller than that of the semiconductor layer.

Further, it is preferred that the composition ratio of the element X be larger than that of the semiconductor layer.

It is preferred that the oxide resistant layer be an oxide which contains each of In and Zn. If the oxide resistant layer does not contain In and Zn, move of elements may occur between the oxide resistant layer and the semiconductor layer, and a shift in threshold voltage may be increased when a stress test or the like is conducted.

In the case of an amorphous oxide film obtained by adding, to the composition contained in the semiconductor layer, one or more elements selected from Cu, Co, Ni, Mn, Fe, Mg, Ca, Sr, Ba, Ag and Au, it is preferred that the In composition ratio be smaller than that of the semiconductor layer. It is preferred that the Ga composition be larger than that of the semiconductor layer.

EXAMPLES

First Aspect

Example 1

(1) Production of a Sputtering Target

As the raw material, powder of indium oxide, zinc oxide and zirconium oxide were mixed such that the atomic ratio [In/(In+Zn+Zr)] became 0.48, the atomic ratio [Zn/(In+Zn+Zr)] became 0.50 and the atomic ratio [Zr/(In+Zn+Zr)] became 0.02. The resulting mixture was supplied to a wet ball mill, and pulverized and mixed for 72 hours to obtain raw material fine powder.

The resulting raw material fine powder was granulated, and press-molded into a size of 10 cm in diameter and 5 mm in thickness. The molded product was put in a firing furnace, and fired at 1500° C. for 12 hours, whereby a sintered body (target) was obtained.

The target had a bulk resistance of 3 mΩ and had a theoretical relative density of 0.99. The target had a high uniform appearance free from unevenness in color.

The theoretical relative density was obtained by calculating the ratio of the density calculated from the specific gravity of each oxide and the amount ratio thereof and the density calculated by the Archimedian method.

(2) Preparation of a Transistor

A field effect transistor similar to that shown in FIG. 1, except that a glass substrate was used as the substrate, was prepared.

On a glass substrate, metal molybdenum was stacked in a thickness of 200 nm at room temperature by RF sputtering, followed by wet etching to form a gate electrode.

Subsequently, on the substrate on which the gate electrode was prepared, SiNx was formed into a film (thickness: 200 nm) at 300° C. by a plasma-enhanced chemical vapor deposition (PECVD) apparatus to form a gate insulating film.

Then, the target produced in (1) was installed in a film forming apparatus of DC magnetron sputtering, which is one of DC sputtering methods, and a film was formed on the gate insulating film, followed by patterning to form a semiconductor layer (thickness: 50 nm).

The sputtering conditions were as follows. Substrate temperature; 25° C., Ultimate pressure; $1\times10^{-6}$ Pa, Atmospheric gas; Ar 99.5% and oxygen 0.5%, Sputtering pressure (total pressure); $2\times10^{-1}$ Pa, Input power; 100 W, Film forming time; 6 minutes, S-T distance; 110 mm.

Then, by using a lift-off process and RF magnetron sputtering (room temperature, Ar100%), source/drain electrodes comprising $In_2O_5$—ZnO were formed.

Thereafter, a heat treatment was conducted in a nitrogen environment at 170° C. for 2 hours, whereby a field effect transistor was produced (a bottom-gate field effect transistor shown in FIG. 2, in which W was 40 μm and L was 4 μm).

Evaluation of a Semiconductor Layer

On a glass substrate (Corning 1737), a semiconductor layer was formed by using the target produced in Example (1), and the semiconductor layer was evaluated.

The semiconductor layer was formed in the same manner as in Example (2) using a film forming apparatus of the DC magnetron sputtering method. As a result, an oxide thin film with a thickness of 50 nm was formed on the glass substrate.

The resulting semiconductor film was analyzed by the ICP (Inductively Coupled Plasma) method, and it was found that the atomic ratio [In/(In+Zn+Zr)] was 0.49, the atomic ratio [Zn/In+Zn+Zr]] was 0.49 and the atomic ratio [Ga/(In+Zn+Zr)] was 0.02.

The above-mentioned semiconductor film was subjected to a heat treatment at 170° C. for 2 hours in a nitrogen atmosphere.

The carrier concentration and the hall mobility of the semiconductor layer after the heat treatment were measured by means of a hall measurement apparatus. As a result, it was found that the film was of n-type, had a carrier concentration of $4\times10^{17}$ cm$^{-3}$ and had a hall mobility of 2 cm$^2$/Vs.

The hall measurement apparatus and the measurement conditions thereof were as follows.

Hall measurement apparatus

Resi Test 8310, manufactured by Toyo Technica Co., Ltd.

Measurement conditions

Measurement temperature: Room temperature (about 25° C.)

Magnetic field for measurement: 0.5 T

Current for measurement: about $10^{-12}$ to $10^{-4}$ A

Measurement mode: AC magnetic field hall measurement

The semiconductor layer was confirmed to be amorphous by an X-ray crystal structure analysis. The surface roughness RMS measured by AMF was 0.2 nm, and the band gap optically obtained was 3.8 eV.

The hall effect was measured by changing the measurement temperature in a range of 77 to 300K. As a result, the film showed a thermal activation type behavior, and the semiconductor film was confirmed to be a non-degenerative semiconductor.

From the relationship between the carrier concentration and the activation energy measured by using the hall effect while changing the temperature, the energy width ($E_0$) on the non-localized level was 6 meV or less.

Further, by a radial distribution function (RDF) obtained by grazing incidence X-ray scattering, a peak indicating In—In was observed at around 0.35 nm, and it was confirmed that the edge-sharing structure of the bixbyite structure of indium oxide remained. When the maximum value of RDF with an interatomic distance of 0.30 to 0.36 nm was taken as A and the maximum value of RDF with an interatomic distance of 0.36 to 0.42 was taken as B, the relationship A/B was 1.3. The average In—In bonding distance obtained by an X-ray absorption spectroscopy was 0.318 nm.

Evaluation of a Transistor

The following evaluation was conducted for the field effect transistor.
(1) Field Effect Mobility (μ), On-off Ratio, Off Current, Gate Leakage Current, S Value, Threshold Voltage (Vth)

Using a semiconductor parameter analyzer (Keithley 4200), measurement was conducted at room temperature, in the air and in the light-shielded environment.
(2) Hysteresis Using a semiconductor parameter analyzer, a transmission curve at the time of increasing the voltage (I-V characteristics) and a transmission curve at the time of decreasing the voltage (I-V characteristics) were obtained, and a difference in voltage between when the voltage was increased and when the voltage was decreased was taken as ΔVg. A transistor having a maximum ΔVg value of 0.5 V or less was evaluated as "slight", a transistor having a maximum ΔVg value of 0.5 to 3 V was evaluated as "moderate" and a transistor having a maximum ΔVg value of 3 V or more was evaluated as "significant".
(3) Stress Test As the stress conditions, a 10 μA-DC voltage was applied at a gate voltage of 15 V at 50° C. for 100 hours. The Vth value before and after the application of a stress was compared to measure an amount of shift in threshold voltage (ΔVth).

The acid resistance and the moisture proof were evaluated as follows.
(1) Acid resistance A 200 nm-thick semiconductor film was formed on a glass substrate under the same conditions as in Example 1(2), and the film was then heat-treated. The semiconductor film was then etched by an oxalic acid-based etching solution (ITO-06, manufactured by Kanto Chemical Co., Ltd.) to evaluate the etching speed at 25° C. Evaluation was made based on the following criteria.
⊚: Shorter than 200 nm/min
○: 200 to 500 nm/min
Δ: 500 to 1000 nm/min
x: 1000 nm/min or more
(2) Moisture Proof The transistor prepared was subjected to a moisture proof test at a temperature of 85° C. and a relative humidity (RH) of 85% for 2000 hours. The resistance before and after the test was measured and classified according to the following criteria. A resistance before the test/the resistance after the test was compared with a resistance after the test/the resistance before the test, and a larger resistance value was taken as the ratio of change.
⊚: Changed by less than twice
○: Changed by 2 to 5 times
Δ: Changed by 5 to 100 times
x Changed by 100 times or larger The results of the measurement are shown in Table 1.

Examples 2 to 29 and Comparative Examples 1 to 7

Sputtering targets were produced in the same manner as in Example 1(1), except that the mixing ratio of indium oxide, zinc oxide and the element X was changed such that the compositions shown in Tables 1 to 4 were attained.

Using these sputtering targets, field effect transistors were produced and evaluated in the same manner as in Example 1(2), except that the film-forming conditions were changed to those shown in Tables 1 to 4.

The following raw materials were used instead of zirconium oxide during the production of the sputtering targets.

Example 12: $HfO_2$, HFO01PB manufactured by Kojundo Chemical Laboratory Co., Ltd.

Example 13: $GeO_2$, GE006PB, manufactured by Kojundo Chemical Laboratory Co., Ltd.

Example 14: $SiO_2$, SIO12PB, manufactured by Kojundo Chemical Laboratory Co., Ltd.

Example 15: $TiO_2$, TIO14PB, manufactured by Kojundo Chemical Laboratory Co., Ltd.

Example 16: $MnO_2$, MNO03PB, manufactured by Kojundo Chemical Laboratory Co., Ltd.

Example 17: $WO_3$, WWO04PB, manufactured by Kojundo Chemical Laboratory Co., Ltd.

Example 18: $MoO_3$, MOO03PB, manufactured by Kojundo Chemical Laboratory Co., Ltd.

Example 19: $V_2O_5$, VVO09PB, manufactured by Kojundo Chemical Laboratory Co., Ltd.

Example 20: $Nb_2O_5$, NBO08PB, manufactured by Kojundo Chemical Laboratory Co., Ltd.

Example 25: CuO, CUO08PB, manufactured by Kojundo Chemical Laboratory Co., Ltd.

Example 26: NiO, NIO11PB, manufactured by Kojundo Chemical Laboratory Co., Ltd.

Example 27: CoO, COO03PB, manufactured by Kojundo Chemical Laboratory Co., Ltd.

Example 28: FeO, FEO01PB, manufactured by Kojundo Chemical Laboratory Co., Ltd.

Example 29: $Cr_2O_3$, CRO01GB, manufactured by Kojundo Chemical Laboratory Co., Ltd.

In Example 21, after the source/drain electrodes were formed, $SiO_2$ was formed into a film with a thickness of 300 nm by RF magnetron sputtering to form a protective layer, whereby a field effect transistor shown in FIG. 4 was prepared.

In Example 22 and Comparative Examples 1 to 7, the semiconductor layer was formed by RF sputtering. Specifically, film formation was conducted by installing the target in a RF magnetron sputtering film forming apparatus.

The sputtering conditions were as follows. Substrate temperature; 25° C., Ultimate pressure; $1 \times 10^{-6}$ Pa, Atmospheric gas; Ar 99.5% and oxygen 0.5%, Sputtering pressure (total pressure); $2 \times 10^{-1}$ Pa, Input power; 100 W, Film forming time; 8 minutes, S-T distance; 100 mm.

In Example 23, a silicon substrate provided with an $SiO_2$ thermally oxidized film was used. The thickness of the $SiO_2$ thermally oxidized film was 100 nm. In this transistor, the $SiO_2$ thermally oxidized film is used as the gate insulating film and the silicon substrate serves as the gate electrode and the substrate.

On the silicon substrate provided with the $SiO_2$ thermally oxidized film, a semiconductor layer, a source electrode and a drain electrode were formed in the same manner as in Example 1.

TABLE 1

|  |  | Examples | | | |
| --- | --- | --- | --- | --- | --- |
|  |  | 1 | 2 | 3 | 4 |
| Method and conditions for forming semiconductor layer | Sputtering method | DC | DC | DC | DC |
|  | Total pressure (Pa) | 0.2 | 0.2 | 0.2 | 0.2 |
|  | Atmospheric gas | Ar: 99.5% $O_2$: 0.5% | Ar: 99.5% $O_2$: 0.5% | Ar: 99.5% $O_2$: 0.5% | Ar: 99.5% $O_2$: 0.5% |
| Composition of target (atmic ratio) | In/(In + Zn + X) | 0.48 | 0.47 | 0.45 | 0.41 |
|  | Zn/(In + Zn + X) | 0.50 | 0.51 | 0.47 | 0.43 |
|  | X/(In + Zn + X) | 0.02 | 0.04 | 0.08 | 0.16 |
|  | Element X | Zr | Zr | Zr | Zr |
|  | In/(In + Zn) | 0.490 | 0.480 | 0.489 | 0.488 |
|  | In/(In + X) | 0.960 | 0.922 | 0.849 | 0.719 |
|  | Zn/(X + Zn) | 0.962 | 0.927 | 0.855 | 0.729 |
| Composition of semiconductor layer (atomic ratio) | In/(In + Zn + X) | 0.49 | 0.48 | 0.46 | 0.42 |
|  | Zn/(In + Zn + X) | 0.49 | 0.48 | 0.46 | 0.42 |
|  | X/(In + Zn + X) | 0.02 | 0.04 | 0.08 | 0.16 |
|  | Element X | Zr | Zr | Zr | Zr |
|  | In/(In + Zn) | 0.500 | 0.500 | 0.500 | 0.500 |
|  | In/(In + X) | 0.961 | 0.923 | 0.852 | 0.724 |
|  | Zn/(X + Zn) | 0.961 | 0.923 | 0.852 | 0.724 |
| State of semiconductor layer | XRD | Amorphous | Amorphous | Amorphous | Amorphous |
| Members used in transistor | Substrate | Glass | Glass | Glass | Glass |
|  | Gate insulating film | SiN$x$ | SiN$x$ | SiN$x$ | SiN$x$ |
|  | Protective layer for semiconductor | None | None | None | None |
| Heat treatment |  | Under $N_2$ 170° C. 2 Hr | Under $N_2$ 170° C. 2 Hr | Under $N_2$ 170° C. 2 Hr | Under $N_2$ 170° C. 2 Hr |
| Transistor properties | Mobility (cm$^2$/Vs) | 19 | 17 | 15 | 11 |
|  | On-off ratio | $10^8$ | $10^9$ | $10^{10}$ | $10^9$ |
|  | Off current (pA) | 0.9 | 0.1 | 0.05 | 0.05 |
|  | Gate leakage current (pA) | 0.6 | 0.09 | 0.05 | 0.05 |
|  | S value | 0.08 | 0.1 | 0.12 | 0.2 |
|  | Vth (V) | 0.3 | 0.4 | 0.5 | 0.9 |
|  | Hysteresis | Slight | Slight | Slight | Slight |
| Stress test | Threshold vol. shift Δ Vth (V) | 0.9 | 0.8 | 0.4 | 0.4 |
| Properties of semiconductor layer | Acid resistance | Δ | Δ | ◯ | ◯ |
|  | Moisture proof | Δ | Δ | ◯ | ◯ |

|  |  | Examples | | | |
| --- | --- | --- | --- | --- | --- |
|  |  | 5 | 6 | 7 | 8 |
| Method and conditions for forming semiconductor layer | Sputtering method | DC | DC | DC | DC |
|  | Total pressure (Pa) | 0.2 | 0.2 | 0.2 | 0.2 |
|  | Atmospheric gas | Ar: 99.5% $O_2$: 0.5% | Ar: 99.5% $O_2$: 0.5% | Ar: 99.5% $O_2$: 0.5% | Ar: 99.5% $O_2$: 0.5% |
| Composition of target (atmic ratio) | In/(In + Zn + X) | 0.39 | 0.20 | 0.30 | 0.59 |
|  | Zn/(In + Zn + X) | 0.41 | 0.72 | 0.62 | 0.33 |
|  | X/(In + Zn + X) | 0.20 | 0.08 | 0.08 | 0.08 |
|  | Element X | Zr | Zr | Zr | Zr |
|  | In/(In + Zn) | 0.488 | 0.217 | 0.326 | 0.641 |
|  | In/(In + X) | 0.661 | 0.714 | 0.789 | 0.881 |
|  | Zn/(X + Zn) | 0.672 | 0.900 | 0.886 | 0.805 |
| Composition of semiconductor layer (atomic ratio) | In/(In + Zn + X) | 0.40 | 0.22 | 0.32 | 0.60 |
|  | Zn/(In + Zn + X) | 0.40 | 0.70 | 0.60 | 0.32 |
|  | X/(In + Zn + X) | 0.20 | 0.08 | 0.08 | 0.08 |
|  | Element X | Zr | Zr | Zr | Zr |
|  | In/(In + Zn) | 0.500 | 0.239 | 0.348 | 0.652 |
|  | In/(In + X) | 0.667 | 0.733 | 0.800 | 0.882 |
|  | Zn/(X + Zn) | 0.667 | 0.897 | 0.882 | 0.800 |
| State of semiconductor layer | XRD | Amorphous | Amorphous | Amorphous | Amorphous |
| Members used in transistor | Substrate | Glass | Glass | Glass | Glass |
|  | Gate insulating film | SiN$x$ | SiN$x$ | SiN$x$ | SiN$x$ |
|  | Protective layer for semiconductor | None | None | None | None |
| Heat treatment |  | Under $N_2$ 170° C. 2 Hr | Under $N_2$ 170° C. 2 Hr | Under $N_2$ 170° C. 2 Hr | Under $N_2$ 170° C. 2 Hr |
| Transistor properties | Mobility (cm$^2$/Vs) | 9 | 5 | 12 | 18 |
|  | On-off ratio | $10^8$ | $10^8$ | $10^{10}$ | $10^8$ |
|  | Off current (pA) | 0.05 | 0.08 | 0.05 | 0.5 |
|  | Gate leakage current (pA) | 0.05 | 0.05 | 0.05 | 0.3 |
|  | S value | 0.26 | 0.27 | 0.15 | 0.9 |
|  | Vth (V) | 1.5 | 0.5 | 0.6 | 0.4 |
|  | Hysteresis | Slight | Slight | Slight | Slight |

TABLE 1-continued

| | | | | | |
|---|---|---|---|---|---|
| Stress test | Threshold vol. shift Δ Vth (V) | 0.4 | 0.7 | 0.5 | 0.5 |
| Properties of | Acid resistance | ◎ | ○ | Δ | ◎ |
| semiconductor layer | Moisture proof | ◎ | ○ | Δ | ◎ |

TABLE 2

| | | Examples | | | |
|---|---|---|---|---|---|
| | | 9 | 10 | 11 | 12 |
| Method and conditions for forming semiconductor layer | Sputtering method | DC | DC | DC | DC |
| | Total pressure (Pa) | 0.2 | 0.2 | 0.2 | 0.2 |
| | Atmospheric gas | Ar: 99.5% $O_2$: 0.5% | Ar: 99.5% $O_2$: 0.5% | Ar: 99.5% $O_2$: 0.5% | Ar: 99.5% $O_2$: 0.5% |
| Composition of target (atomic ratio) | In/(In + Zn + X) | 0.69 | 0.45 | 0.19 | 0.48 |
| | Zn/(In + Zn + X) | 0.23 | 0.21 | 0.41 | 0.50 |
| | X/(In + Zn + X) | 0.08 | 0.34 | 0.40 | 0.02 |
| | Element X | Zr | Zr | Zr | Hf |
| | In/(In + Zn) | 0.750 | 0.682 | 0.317 | 0.490 |
| | In/(In + X) | 0.896 | 0.570 | 0.322 | 0.960 |
| | Zn/(X + Zn) | 0.742 | 0.382 | 0.506 | 0.962 |
| Composition of semiconductor layer (atomic ratio) | In/(In + Zn + X) | 0.70 | 0.46 | 0.20 | 0.49 |
| | Zn/(In + Zn + X) | 0.22 | 0.20 | 0.40 | 0.49 |
| | X/(In + Zn + X) | 0.08 | 0.34 | 0.40 | 0.02 |
| | Element X | Zr | Zr | Zr | Hf |
| | In/(In + Zn) | 0.761 | 0.697 | 0.333 | 0.500 |
| | In/(In + X) | 0.897 | 0.575 | 0.333 | 0.961 |
| | Zn/(X + Zn) | 0.733 | 0.370 | 0.500 | 0.961 |
| State of semiconductor layer | XRD | Amorphous | Amorphous | Amorphous | Amorphous |
| Members used in transistor | Substrate | Glass | Glass | Glass | Glass |
| | Gate insulating film | SiN$x$ | SiN$x$ | SiN$x$ | SiN$x$ |
| | Protective layer for semiconductor | None | None | None | None |
| Heat treatment | | Under $N_2$ 170° C. 2 Hr | Under $N_2$ 170° C. 2 Hr | Under $N_2$ 170° C. 2 Hr | Under $N_2$ 170° C. 2 Hr |
| Transistor properties | Mobility (cm$^2$/Vs) | 26 | 6 | 2 | 18 |
| | On-off ratio | $10^8$ | $10^8$ | $10^7$ | $10^8$ |
| | Off current (pA) | 1 | 0.05 | 1.8 | 0.9 |
| | Gate leakage current (pA) | 0.5 | 0.05 | 0.5 | 0.6 |
| | S value | 0.37 | 0.47 | 0.7 | 0.08 |
| | Vth (V) | 0.3 | 3.2 | 4 | 0.3 |
| | Hysteresis | Slight | Slight | Slight | Slight |
| Stress test | Threshold vol. shift Δ Vth (V) | 0.7 | 0.3 | 0.3 | 0.9 |
| Properties of semiconductor layer | Acid resistance | ○ | ○ | ○ | Δ |
| | Moisture proof | ○ | ○ | ○ | Δ |

| | | Examples | | | |
|---|---|---|---|---|---|
| | | 13 | 14 | 15 | 16 |
| Method and conditions for forming semiconductor layer | Sputtering method | DC | DC | DC | DC |
| | Total pressure (Pa) | 0.2 | 0.2 | 0.2 | 0.2 |
| | Atmospheric gas | Ar: 99.5% $O_2$: 0.5% | Ar: 99.5% $O_2$: 0.5% | Ar: 99.5% $O_2$: 0.5% | Ar: 99.5% $O_2$: 0.5% |
| Composition of target (atomic ratio) | In/(In + Zn + X) | 0.48 | 0.48 | 0.48 | 0.48 |
| | Zn/(In + Zn + X) | 0.50 | 0.50 | 0.50 | 0.50 |
| | X/(In + Zn + X) | 0.02 | 0.02 | 0.02 | 0.02 |
| | Element X | Ge | Si | Ti | Mn |
| | In/(In + Zn) | 0.490 | 0.490 | 0.490 | 0.490 |
| | In/(In + X) | 0.960 | 0.960 | 0.960 | 0.960 |
| | Zn/(X + Zn) | 0.962 | 0.962 | 0.962 | 0.962 |
| Composition of semiconductor layer (atomic ratio) | In/(In + Zn + X) | 0.49 | 0.49 | 0.49 | 0.49 |
| | Zn/(In + Zn + X) | 0.49 | 0.49 | 0.49 | 0.49 |
| | X/(In + Zn + X) | 0.02 | 0.02 | 0.02 | 0.02 |
| | Element X | Ge | Si | Ti | Mn |
| | In/(In + Zn) | 0.500 | 0.500 | 0.500 | 0.500 |
| | In/(In + X) | 0.961 | 0.961 | 0.961 | 0.961 |
| | Zn/(X + Zn) | 0.961 | 0.961 | 0.961 | 0.961 |
| State of semiconductor layer | XRD | Amorphous | Amorphous | Amorphous | Amorphous |
| Members used in transistor | Substrate | Glass | Glass | Glass | Glass |
| | Gate insulating film | SiN$x$ | SiN$x$ | SiN$x$ | SiN$x$ |
| | Protective layer for semiconductor | None | None | None | None |
| Heat treatment | | Under $N_2$ 170° C. 2 Hr | Under $N_2$ 170° C. 2 Hr | Under $N_2$ 170° C. 2 Hr | Under $N_2$ 170° C. 2 Hr |

TABLE 2-continued

| | | | | | |
|---|---|---|---|---|---|
| Transistor properties | Mobility (cm$^2$/Vs) | 18 | 18 | 18 | 18 |
| | On-off ratio | 10$^8$ | 10$^8$ | 10$^8$ | 10$^8$ |
| | Off current (pA) | 0.9 | 0.9 | 0.9 | 0.9 |
| | Gate leakage current (pA) | 0.6 | 0.6 | 0.6 | 0.6 |
| | S value | 0.09 | 0.09 | 0.09 | 0.09 |
| | Vth (V) | 0.3 | 0.3 | 0.3 | 0.3 |
| | Hysteresis | Slight | Slight | Slight | Slight |
| Stress test | Threshold vol. shift ΔVth (V) | 0.9 | 0.9 | 0.9 | 0.9 |
| Properties of | Acid resistance | Δ | Δ | Δ | Δ |
| semiconductor layer | Moisture proof | Δ | Δ | Δ | Δ |

TABLE 3

| | | Examples | | | |
|---|---|---|---|---|---|
| | | 17 | 18 | 19 | 20 |
| Method and conditions for forming semiconductor layer | Sputtering method | DC | DC | DC | DC |
| | Total pressure (Pa) | 0.2 | 0.2 | 0.2 | 0.2 |
| | Atmospheric gas | Ar: 99.5% O$_2$: 0.5% | Ar: 99.5% O$_2$: 0.5% | Ar: 99.5% O$_2$: 0.5% | Ar: 99.5% O$_2$: 0.5% |
| Composition of target (atmic ratio) | In/(In + Zn + X) | 0.48 | 0.48 | 0.48 | 0.48 |
| | Zn/(In + Zn + X) | 0.50 | 0.50 | 0.50 | 0.50 |
| | X/(In + Zn + X) | 0.02 | 0.02 | 0.02 | 0.02 |
| | Element X | W | Mo | V | Nb |
| | In/(In + Zn) | 0.490 | 0.490 | 0.490 | 0.490 |
| | In/(In + X) | 0.960 | 0.960 | 0.960 | 0.960 |
| | Zn/(X + Zn) | 0.962 | 0.962 | 0.962 | 0.962 |
| Composition of semiconductor layer (atomic ratio) | In/(In + Zn + X) | 0.49 | 0.49 | 0.49 | 0.49 |
| | Zn/(In + Zn + X) | 0.49 | 0.49 | 0.49 | 0.49 |
| | X/(In + Zn + X) | 0.02 | 0.02 | 0.02 | 0.02 |
| | Element X | W | Mo | V | Nb |
| | In/(In + Zn) | 0.500 | 0.500 | 0.500 | 0.500 |
| | In/(In + X) | 0.961 | 0.961 | 0.961 | 0.961 |
| | Zn/(X + Zn) | 0.961 | 0.961 | 0.961 | 0.961 |
| State of semiconductor layer | XRD | Amorphous | Amorphous | Amorphous | Amorphous |
| Members used in transistor | Substrate | Glass | Glass | Glass | Glass |
| | Gate insulating film | SiNx | SiNx | SiNx | SiNx |
| | Protective layer for semiconductor | None | None | None | None |
| Heat treatment | | Under N$_2$ 170° C. 2 Hr | Under N$_2$ 170° C. 2 Hr | Under N$_2$ 170° C. 2 Hr | Under N$_2$ 170° C. 2 Hr |
| Transistor properties | Mobility (cm$^2$/Vs) | 18 | 18 | 18 | 18 |
| | On-off ratio | 10$^8$ | 10$^8$ | 10$^8$ | 10$^8$ |
| | Off current (pA) | 0.9 | 0.9 | 0.9 | 0.9 |
| | Gate leakage current (pA) | 0.6 | 0.6 | 0.6 | 0.6 |
| | S value | 0.09 | 0.09 | 0.09 | 0.09 |
| | Vth (V) | 0.3 | 0.3 | 0.3 | 0.3 |
| | Hysteresis | Slight | Slight | Slight | Slight |
| Stress test | Threshold vol. shift ΔVth (V) | 0.9 | 0.9 | 0.9 | 0.9 |
| Properties of | Acid resistance | Δ | Δ | Δ | Δ |
| semiconductor layer | Moisture proof | Δ | Δ | Δ | Δ |

| | | Examples | | | |
|---|---|---|---|---|---|
| | | 21 | 22 | 23 | 24 |
| Method and conditions for forming semiconductor layer | Sputtering method | DC | RF | DC | DC |
| | Total pressure (Pa) | 0.2 | 0.2 | 0.2 | 0.2 |
| | Atmospheric gas | Ar: 99.5% O$_2$: 0.5% | Ar: 99% O$_2$: 1% | Ar: 99.5% O$_2$: 0.5% | Ar: 99.5% O$_2$: 0.5% |
| Composition of target (atmic ratio) | In/(In + Zn + X) | 0.47 | 0.47 | 0.48 | 0.31 |
| | Zn/(In + Zn + X) | 0.49 | 0.49 | 0.5 | 0.33 |
| | X/(In + Zn + X) | 0.04 | 0.04 | 0.02 | 0.36 |
| | Element X | Zr | Zr | Zr | Zr |
| | In/(In + Zn) | 0.490 | 0.490 | 0.500 | 0.484 |
| | In/(In + X) | 0.922 | 0.922 | 0.961 | 0.463 |
| | Zn/(X + Zn) | 0.925 | 0.925 | 0.961 | 0.478 |
| Composition of semiconductor layer (atomic ratio) | In/(In + Zn + X) | 0.48 | 0.48 | 0.49 | 0.32 |
| | Zn/(In + Zn + X) | 0.48 | 0.48 | 0.49 | 0.32 |
| | X/(In + Zn + X) | 0.04 | 0.04 | 0.02 | 0.36 |
| | Element X | Zr | Zr | Zr | Zr |
| | In/(In + Zn) | 0.500 | 0.500 | 0.500 | 0.500 |
| | In/(In + X) | 0.923 | 0.923 | 0.961 | 0.471 |
| | Zn/(X + Zn) | 0.923 | 0.923 | 0.961 | 0.471 |

TABLE 3-continued

| State of semiconductor layer | XRD | Amorphous | Amorphous | Amorphous | Amorphous |
|---|---|---|---|---|---|
| Members used in transistor | Substrate | Glass | Glass | Silicon | Glass |
| | Gate insulating film | SiNx | SiNx | SiO$_2$ Thermally oxidized film | SiNx |
| | Protective layer for semiconductor | SiO$_2$ | None | None | None |
| Heat treatment | | Under N$_2$ 170° C. 2 Hr | Under N$_2$ 170° C. 2 Hr | Under N$_2$ 170° C. 2 Hr | Under N$_2$ 170° C. 2 Hr |
| Transistor properties | Mobility (cm$^2$/Vs) | 17 | 15 | 18 | 5 |
| | On-off ratio | 10$^9$ | 10$^8$ | 10$^{10}$ | 10$^9$ |
| | Off current (pA) | 0.05 | 0.1 | 0.05 | 0.05 |
| | Gate leakage current (pA) | 0.05 | 0.12 | 0.05 | 0.05 |
| | S value | 0.12 | 0.15 | 0.2 | 0.29 |
| | Vth (V) | 0.3 | 0.6 | 0.2 | 0.9 |
| | Hysteresis | Slight | Slight | Slight | Slight |
| Stress test | Threshold vol. shift ΔVth (V) | 0.8 | 0.9 | 0.6 | 0.4 |
| Properties of semiconductor layer | Acid resistance | Δ | Δ | Δ | ◎ |
| | Moisture proof | ○ | Δ | Δ | ◎ |

TABLE 4

| | | Examples | | | | |
|---|---|---|---|---|---|---|
| | | 25 | 26 | 27 | 28 | 29 |
| Method and conditions for forming semiconductor layer | Sputtering method | DC | DC | DC | DC | DC |
| | Total pressure (Pa) | 0.2 | 0.2 | 0.2 | 0.2 | 0.2 |
| | Atmospheric gas | Ar: 99.5% O$_2$: 0.5% | Ar: 99.5% O$_2$: 0.5% | Ar: 99.5% O$_2$: 0.5% | Ar: 99.5% O$_2$: 0.5% | Ar: 99.5% O$_2$: 0.5% |
| Composition of target (atomic ratio) | In/(In + Zn + X) | 0.48 | 0.48 | 0.48 | 0.48 | 0.48 |
| | Zn/(In + Zn + X) | 0.50 | 0.50 | 0.50 | 0.50 | 0.50 |
| | X/(In + Zn + X) | 0.02 | 0.02 | 0.02 | 0.02 | 0.02 |
| | Element X | Cu | Ni | Co | Fe | Cr |
| | In/(In + Zn) | 0.500 | 0.500 | 0.500 | 0.500 | 0.500 |
| | In/(In + X) | 0.961 | 0.961 | 0.961 | 0.961 | 0.961 |
| | Zn/(X + Zn) | 0.961 | 0.961 | 0.961 | 0.961 | 0.961 |
| Composition of semiconductor layer (atomic ratio) | In/(In + Zn + X) | 0.49 | 0.49 | 0.49 | 0.49 | 0.49 |
| | Zn/(In + Zn + X) | 0.49 | 0.49 | 0.49 | 0.49 | 0.49 |
| | X/(In + Zn + X) | 0.02 | 0.02 | 0.02 | 0.02 | 0.02 |
| | Element X | Cu | Ni | Co | Fe | Cr |
| | In/(In + Zn) | 0.500 | 0.500 | 0.500 | 0.500 | 0.500 |
| | In/(In + X) | 0.961 | 0.961 | 0.961 | 0.961 | 0.961 |
| | Zn/(X + Zn) | 0.961 | 0.961 | 0.961 | 0.961 | 0.961 |
| State of semiconductor layer | XRD | Amorphous | Amorphous | Amorphous | Amorphous | Amorphous |
| Members used in transistor | Substrate | Glass | Glass | Glass | Glass | Glass |
| | Gate insulating film | SiNx | SiNx | SiNx | SiNx | SiNx |
| | Protective layer for semiconductor | None | None | None | None | None |
| Heat treatment | | Under N$_2$ 170° C. 2 Hr | Under N$_2$ 170° C. 2 Hr | Under N$_2$ 170° C. 2 Hr | Under N$_2$ 170° C. 2 Hr | Under N$_2$ 170° C. 2 Hr |
| Transistor properties | Mobility (cm$^2$/Vs) | 18 | 18 | 18 | 18 | 18 |
| | On-off ratio | 10$^8$ | 10$^8$ | 10$^8$ | 10$^8$ | 10$^8$ |
| | Off current (pA) | 0.9 | 0.9 | 0.9 | 0.9 | 0.9 |
| | Gate leakage current (pA) | 0.6 | 0.6 | 0.6 | 0.6 | 0.6 |
| | S value | 0.09 | 0.09 | 0.09 | 0.09 | 0.09 |
| | Vth (V) | 0.3 | 0.3 | 0.3 | 0.3 | 0.3 |
| | Hysteresis | Slight | Slight | Slight | Slight | Slight |
| Stress test | Threshold vol. shift ΔVth (V) | 0.9 | 0.9 | 0.9 | 0.9 | 0.9 |
| Properties of semiconductor layer | Acid resistance | Δ | Δ | Δ | Δ | Δ |
| | Moisture proof | Δ | Δ | Δ | Δ | Δ |

TABLE 5

| | | Com. Examples | | | |
|---|---|---|---|---|---|
| | | 1 | 2 | 3 | 4 |
| Method and conditions for forming semiconductor layer | Sputtering method | RF | RF | RF | RF |
| | Total pressure (Pa) | 0.2 | 0.2 | 0.2 | 0.2 |
| | Atmospheric gas | Ar: 99.5% O$_2$: 0.5% | Ar: 99.5% O$_2$: 0.5% | Ar: 99.5% O$_2$: 0.5% | Ar: 99.5% O$_2$: 0.5% |

TABLE 5-continued

| | | | | | |
|---|---|---|---|---|---|
| Composition of target (atomic ratio) | In/(In + Zn + X) | 0.49 | 0.02 | 0.49 | 0.10 |
| | Zn/(In + Zn + X) | 0.51 | 0.50 | 0.02 | 0.10 |
| | X/(In + Zn + X) | — | 0.48 | 0.49 | 0.8 |
| | Element X | — | Zr | Zr | Zr |
| | In/(In + Zn) | 0.490 | 0.038 | 0.961 | 0.500 |
| | In/(In + X) | 1.000 | 0.040 | 0.500 | 0.111 |
| | Zn/(X + Zn) | 1.000 | 0.510 | 0.039 | 0.111 |
| Composition of semiconductor layer (atomic ratio) | In/(In + Zn + X) | 0.50 | 0.02 | 0.49 | 0.10 |
| | Zn/(In + Zn + X) | 0.50 | 0.49 | 0.02 | 0.10 |
| | X/(In + Zn + X) | — | 0.49 | 0.49 | 0.80 |
| | Element X | — | Zr | Zr | Zr |
| | In/(In + Zn) | 0.500 | 0.039 | 0.961 | 0.500 |
| | In/(In + X) | 1.000 | 0.039 | 0.500 | 0.111 |
| | Zn/(X + Zn) | 1.000 | 0.500 | 0.039 | 0.111 |
| State of semiconductor layer | XRD | Amorphous | Amorphous | Amorphous | Polycrystalline |
| Members used in transistor | Substrate | Glass | Glass | Glass | Glass |
| | Gate insulating film | SiN$x$ | SiN$x$ | SiN$x$ | SiN$x$ |
| | Protective layer for semiconductor | None | None | None | None |
| Heat treatment | | Under N$_2$ 170° C. 2 Hr | Under N$_2$ 170° C. 2 Hr | Under N$_2$ 170° C. 2 Hr | Under N$_2$ 170° C. 2 Hr |
| Properties of transistor | Mobility (cm$^2$/Vs) | 21 | — | 0.5 | — |
| | On-off current | 10$^7$ | — | 10$^3$ | — |
| | Off current (pA) | 5 | — | 10 | — |
| | Gate leakage current (pA) | 2 | — | 2 | — |
| | S value | 0.1 | — | 2 | — |
| | Vth (V) | 0.3 | — | 6 | — |
| | Hysteresis | Slight | — | Slight | — |
| Stress test | Threshold vol. shift Δ Vth (V) | 1.5 | — | 2 | — |
| Properties of semiconductor layer | Acid resistance | X | Δ | ◎ | ◎ |
| | Moisture proof | X | Δ | ◎ | ◎ |
| Remarks | | | Not driven | | Not driven |

| | | Com. Examples | | |
|---|---|---|---|---|
| | | 5 | 6 | 7 |
| Method and conditions for forming semiconductor layer | Sputtering method | RF | RF | RF |
| | Total pressure (Pa) | 0.2 | 0.2 | 0.2 |
| | Atmospheric gas | Ar: 99.5% O$_2$: 0.5% | Ar: 99.5% O$_2$: 0.5% | Ar: 99.5% O$_2$: 0.5% |
| Composition of target (atomic ratio) | In/(In + Zn + X) | 1.00 | | |
| | Zn/(In + Zn + X) | | 1.00 | |
| | X/(In + Zn + X) | | | 1 |
| | Element X | | | Zr |
| | In/(In + Zn) | 1.000 | — | — |
| | In/(In + X) | 1.000 | — | — |
| | Zn/(X + Zn) | — | 1.000 | — |
| Composition of semiconductor layer (atomic ratio) | In/(In + Zn + X) | 1.00 | | |
| | Zn/(In + Zn + X) | | 1.00 | |
| | X/(In + Zn + X) | | | 1.00 |
| | Element X | | | Zr |
| | In/(In + Zn) | 1.000 | — | — |
| | In/(In + X) | 1.000 | — | — |
| | Zn/(X + Zn) | — | 1.000 | — |
| State of semiconductor layer | XRD | Polycrystalline | Polycrystalline | Polycrystalline |
| Members used in transistor | Substrate | Glass | Glass | Glass |
| | Gate insulating film | SiN$x$ | SiN$x$ | SiN$x$ |
| | Protective layer for semiconductor | None | None | None |
| Heat treatment | | Under N$_2$ 170° C. 2 Hr | Under N$_2$ 170° C. 2 Hr | Under N$_2$ 170° C. 2 Hr |
| Properties of transistor | Mobility (cm$^2$/Vs) | — | 0.01 | — |
| | On-off current | — | 10$^3$ | — |
| | Off current (pA) | 1000000 | 1 | — |
| | Gate leakage current (pA) | 1000000 | 1 | — |
| | S value | — | 0.4 | — |
| | Vth (V) | Normally on | −0.5 | — |
| | Hysteresis | — | Moderate | — |
| Stress test | Threshold vol. shift Δ Vth (V) | — | 5 | — |
| Properties of semiconductor layer | Acid resistance | ○ | X | ◎ |
| | Moisture proof | ○ | X | ◎ |
| Remarks | | | Not driven | Not driven |

Examples of a Sputtering Target

Example 30

As the raw material, indium oxide powder, zinc oxide powder and zirconium oxide powder were mixed such that the atomic ratio [In/(In+Zn+Zr)] became 0.4, the atomic ratio [Zn/(In+Zn+Zr)] became 0.4 and the atomic ratio [Zr/(In+Zn+Zr)] became 0.2. The mixture was supplied to a wet ball mill, and pulverized and mixed for 72 hours, thereby to obtain raw material fine powder.

The resulting raw material fine powder was granulated, and press-molded into a size of 20 cm in diameter and 5 mm in thickness. The molded product was put in a firing furnace, and fired at 1400° C. for 12 hours, whereby a sintered body (target) was obtained.

The target had a bulk resistance of 5 mΩ, a theoretical relative density of 0.98 and a transverse rupture strength of 12 kg/mm$^2$. The target was a uniform appearance free from unevenness in color.

Comparative Example 8

As the raw material, indium oxide powder, zinc oxide powder and gallium oxide powder were mixed such that the atomic ratio [In/(In+Zn+Ga)] became 0.4, the atomic ratio [Zn/(In+Zn+Ga)] became 0.4 and the atomic ratio [Ga/(In+Zn+Ga)] became 0.2. The mixture was supplied to a wet ball mill, and pulverized and mixed for 72 hours, thereby to obtain raw material fine powder.

The resulting raw material fine powder was granulated, and press-molded into a size of 20 cm in diameter and 5 mm in thickness. The molded product was put in a firing furnace, and fired at 1400° C. for 12 hours, whereby a sintered body (target) was obtained.

The target had a bulk resistance of 70 mΩ and had a theoretical relative density of 0.82. The transverse rupture strength of the target was 7 kg/mm$^2$. Slight unevenness in color was observed in the target.

Figure 6:
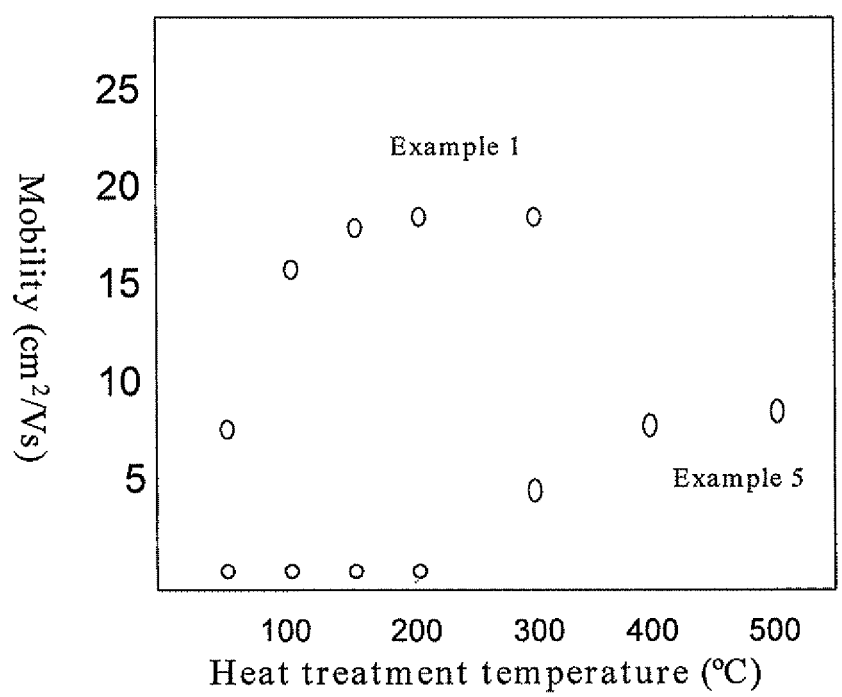
FIG. 6 is a graph showing the relationship between the heat treatment temperature and the mobility of the semiconductor layer.

FIG. 6 shows the relationship between the heat treatment temperature and the mobility for the semiconductor layers which have the same compositions as those of Example 1 and Example 5. The heat treatment was conducted for 2 hours.

The mobility was stabilized at 150° C. with the composition of Example 1. However, with the composition of Example 5, a heat treatment of 300° C. or higher was required to stabilize the mobility.

Second Aspect

Preparation of a Sputtering Target

Example 31

Target I

As the raw material, 5N (purity: 99.999%) indium oxide powder (INO04PB, manufactured by Kojundo Chemical Laboratory Co., Ltd.), 5N zinc oxide powder (ZNO04PB, manufactured by Kojundo Chemical Laboratory Co., Ltd.) and 5N aluminum oxide powder (manufactured by Kojundo Chemical Laboratory Co., Ltd.) were mixed such that the atomic ratio [In/(In+Zn+Al)] became 0.48, the atomic ratio [Zn/(In+Zn+Al)] became 0.50 and the atomic ratio [Al/(In+Zn+Al)] became 0.02. The mixture was supplied to a wet type ball mill and pulverized and mixed for 72 hours to obtain raw material fine powder.

The resulting raw material fine powder was granulated, and press-molded into a size of 10 cm in diameter and 5 mm in thickness. The molded product was put in a firing furnace, and fired at 1500° C. for 12 hours, whereby a sintered body (target) was obtained.

The target was pulverized and analyzed by ICP, and it was found that impurities such as Sn (tin), Ge (germanium), Si (silicon), Ti (titanium), Zr (zirconium) and Hf (hafnium) were not contained. The bulk resistance of the target was 20 mΩ and the theoretical relative density was 0.95.

Example 32

Target II

As the raw material, indium oxide which had been collected from used ITO targets or the like, 5N zinc oxide powder (ZNO04PB, manufactured by Kojundo Chemical Laboratory Co., Ltd.) and 4N aluminum oxide powder (ALO12PB, manufactured by Kojundo Chemical Laboratory Co., Ltd.) were mixed such that the atomic ratio [In/(In+Zn+Al)] became 0.48, the atomic ratio [Zn/(In+Zn+Al)] became 0.50 and the atomic ratio [Al/(In+Zn+Al)] became 0.02. The mixture was supplied to a wet type ball mill and pulverized and mixed for 72 hours to obtain raw material fine powder.

The resulting raw material fine powder was granulated, and press-molded into a size of 10 cm in diameter and 5 mm in thickness. The molded product was put in a firing furnace, and fired at 1500° C. for 12 hours, whereby a sintered body (target) was obtained.

The target was pulverized and analyzed by ICP, and it was found that Sn (tin) was contained in an amount of 500 ppm as an impurity. The target had a bulk resistance of 3 mΩ and had a theoretical relative density of 0.99. The target was a uniform appearance free from unevenness in color.

Examples 33 to 37

Targets III-VII

Sputtering targets were prepared in the same process as in Target I except that Ge, Si, Ti, Zr or Hf was added in the form of an oxide such that the content thereof became 500 atomic ppm relative to the total elements of the raw material. The resulting target had a quality almost equivalent to that of Target II. The appearance thereof was more uniform and beautiful as compared with Target II.

Evaluation of a Sputtering Target

Target I

Target I, which had been prepared in Example 31, was installed in a film forming apparatus of RF magnetron sputtering which is one of RF sputtering methods, and a semiconductor film was formed on a glass substrate (Corning 1737).

The sputtering conditions were as follows. Substrate temperature; 25° C., Ultimate pressure; 1×10$^{-6}$ Pa, Atmospheric gas; Ar 99.5% and oxygen 0.5%, Sputtering pressure (total pressure); 2×10$^{-1}$ Pa, Input power; 100 W, Film forming time; 8 minutes, S-T distance; 100 mm.

As a result, a 70 nm-thick semiconductor film was formed on the glass substrate.

The resulting film was analyzed by ICP, and it was found that the atomic ratio [In/In+Zn+Al)] was 0.49, the atomic ratio [Zn/(In+Zn+Al)] was 0.49 and the atomic ratio [Al/(In+Zn+Al)] was 0.02.

As mentioned above, a semiconductor film could be formed by using Target I.

Targets II to VII

A semiconductor film was formed in the same manner as in Target I. A semiconductor film could be formed with substantially the same results as in Target I.

However, as compared with Target I, when continuously discharged for a long period of time, reduction in frequency of abnormal discharge or amount of yellow flakes during sputtering could be confirmed.

Evaluation of a Semiconductor Film

The semiconductor film as mentioned above which was formed by using Target I was subjected to a heat treatment at 150° C. for 2 hours in a nitrogen environment.

For the semiconductor film after the heat treatment, the carrier concentration and the hail mobility were measured by a hall measurement apparatus. As a result, it was found that the film was of n-type, had a carrier concentration of $4 \times 10^{17}$ cm$^{-3}$ and had a hall mobility of 3 cm$^2$/Vs.

The semiconductor layer was confirmed to be amorphous by an X-ray crystal structure analysis. The surface roughness RMS measured by means of an atomic force microscope (AMF) was 0.2 nm, and the band gap optically obtained was 3.9 eV.

The hall effect was measured by changing the measurement temperature in a range of 77 to 300K. As a result, the film showed a thermal activation type behavior, and the semiconductor film was confirmed to be a non-degenerative semiconductor.

From the relationship between the carrier concentration and the activation energy measured by using the hall effect while changing the temperature, the energy width ($E_0$) on the non-localized level was 6 meV or less. Further, by a radial distribution function (RDF) obtained by X-ray scattering, a peak indicating In—In was observed at around 0.35 nm, and it was confirmed that the edge-sharing structure of the bixbiyte structure of indium oxide remained. When the maximum value of RDF with an interatomic distance of 0.30 to 0.36 nm was taken as A and the maximum value of RDF with an interatomic distance of 0.36 to 0.42 was taken as B, the relationship A/B was 1.5. The average In—In bonding distance obtained by an X-ray absorption spectroscopy was 0.317 nm.

Preparation of a Field Effect Transistor

Example 38

A transistor similar to that shown in FIG. 1, except that a glass substrate was used as the substrate, was prepared.

On a glass substrate, metal molybdenum was stacked in a thickness of 200 nm at room temperature by RF sputtering, followed by wet etching to form a gate electrode.

Subsequently, on the substrate on which the gate electrode was prepared, SiNx was formed into a film (thickness: 200 nm) at 300° C. by a plasma-enhanced chemical vapor deposition (PECVD) apparatus to form a gate insulating film.

Then, by using Target I produced in Example 31, a film was formed under the same conditions as those in the preparation of the semiconductor film prepared for evaluating Target I. The film was then patterned to form a semiconductor layer.

Then, by using a lift-off process and RF magnetron sputtering (room temperature, Ar 100%), source/drain electrodes formed of $In_2O_3$—ZnO were formed.

Thereafter, a heat treatment was conducted in a nitrogen environment at 150° C. for 2 hours, whereby a field effect transistor was produced (a bottom-gate field effect transistor shown in FIG. 2, in which W was 50 μm and L was 4 μm).

The resulting field effect transistor was evaluated in the same manner as in Example 1. The measurement results are shown in Table 6.

Examples 39 to 61 and Comparative Examples 11 to 18

Sputtering targets were prepared in the same manner as in Example 31, except that the mixing ratio of indium oxide, zinc oxide and an oxide of the element X was adjusted such that the compositions shown in tables 6 to 9 were attained.

Using these targets, field effect transistors were produced and evaluated in the same manner as in Example 38, except that the film-forming conditions were changed to those shown in Tables 8 to 9.

The following raw materials were used instead of aluminum oxide during the production of the sputtering targets.

Example 49: $B_2O_3$, BBO06PB manufactured by Kojundo Chemical Laboratory Co., Ltd.

Example 50: $Y_2O_3$, YYO03PB, manufactured by Kojundo Chemical Laboratory Co., Ltd.

Example 51: $Sc_2O_3$, SCO01PB, manufactured by Kojundo Chemical Laboratory Co., Ltd.

Example 52: $CeO_2$, CEO05PB, manufactured by Kojundo Chemical Laboratory Co., Ltd.

Example 53: $Nd_2O_3$, NDO01PB, manufactured by Kojundo Chemical Laboratory Co., Ltd.

Example 54: $Sm_2O_3$, SMO01PB, manufactured by Kojundo Chemical Laboratory Co., Ltd.

Example 55: $Gd_2O_3$, GDO01PB, manufactured by Kojundo Chemical Laboratory Co., Ltd.

Example 56: $Tb_2O_3$, TBO02PB, manufactured by Kojundo Chemical Laboratory Co., Ltd.

Example 57: $Yb_2O_3$, YBO02PB, manufactured by Kojundo Chemical Laboratory Co., Ltd.

In Example 58, after the formation of the source/drain electrodes, an $SiO_2$ film was formed in a thickness of 300 nm by RF magnetron sputtering to form a protective layer, whereby a field effect transistor shown in FIG. 4 was prepared.

In Example 59, the semiconductor layer was formed by DC sputtering. The target was installed in a DC magnetron sputtering film forming apparatus (manufactured by Shinko Seiki Co., Ltd.), and a semiconductor layer was formed on a glass substrate (Corning 1737).

The sputtering conditions were as follows. Substrate temperature; 25° C., Ultimate pressure; $1 \times 10^{-6}$ Pa, Atmospheric gas; Ar 99% and oxygen 1.0%, Sputtering pressure (total pressure); $2 \times 10^{-1}$ Pa, Input power; 100 W, Film forming time; 8 minutes, S-T distance; 100 mm.

Prior to the film formation, the chamber was sufficiently baked, the ultimate pressure was sufficiently decreased, and the substrate was installed by means of a loadlock, whereby the water partial pressure during the film formation was lowered. The $H_2O$ (water) in the sputtering chamber was analyzed by a quadrupol mass spectrometer (Q-mass) to measure the water partial pressure during the film formation. The water partial pressure during the film formation was found to be $1 \times 10^{-6}$ Pa or less.

In Example 60, a silicon substrate with an $SiO_2$ thermally oxidized film was used. The thickness of the $SiO_2$ thermally oxidized film was 100 nm. In this transistor, the $SiO_2$ thermally oxidized film is used as the gate insulating film is and the silicon substrate serves as the gate electrode and the substrate.

On the silicon substrate with the $SiO_2$ thermally oxidized film, a semiconductor layer, a source electrode and a drain electrode were formed in the same manner as in Example 38.

TABLE 6

|  |  | Examples | | | |
| --- | --- | --- | --- | --- | --- |
|  |  | 38 | 39 | 40 | 41 |
| Method and conditions for forming semiconductor layer | Sputtering method | RF | RF | RF | RF |
|  | Total pressure (Pa) | 0.2 | 0.2 | 0.2 | 0.2 |
|  | Atmospheric gas | Ar: 99.5% $O_2$: 0.5% | Ar: 99.5% $O_2$: 0.5% | Ar: 99.5% $O_2$: 0.5% | Ar: 99.5% $O_2$: 0.5% |
| Composition of target (atomic ratio) | In/(In + Zn + X) | 0.48 | 0.47 | 0.46 | 0.45 |
|  | Zn/(In + Zn + X) | 0.50 | 0.49 | 0.48 | 0.47 |
|  | X/(In + Zn + X) | 0.02 | 0.04 | 0.06 | 0.08 |
|  | Element X | Al | Al | Al | Al |
|  | In/(In + Zn) | 0.490 | 0.490 | 0.489 | 0.489 |
|  | In/(In + X) | 0.960 | 0.922 | 0.885 | 0.849 |
|  | Zn/(X + Zn) | 0.962 | 0.925 | 0.889 | 0.855 |
| Composition of semiconductor layer (atomic ratio) | In/(In + Zn + X) | 0.49 | 0.48 | 0.47 | 0.46 |
|  | Zn/(In + Zn + X) | 0.49 | 0.48 | 0.47 | 0.46 |
|  | X/(In + Zn + X) | 0.02 | 0.04 | 0.06 | 0.08 |
|  | Element X | Al | Al | Al | Al |
|  | In/(In + Zn) | 0.500 | 0.500 | 0.500 | 0.500 |
|  | In/(In + X) | 0.961 | 0.923 | 0.887 | 0.852 |
|  | Zn/(X + Zn) | 0.961 | 0.923 | 0.887 | 0.852 |
| State of semiconductor layer | XRD | Amorphous | Amorphous | Amorphous | Amorphous |
| Members used in transistor | Substrate | Glass | Glass | Glass | Glass |
|  | Gate insulating film | SiNx | SiNx | SiNx | SiNx |
|  | Protective layer for semiconductor | None | None | None | None |
| Heat treatment |  | Under $N_2$ 150° C. 2 Hr | Under $N_2$ 150° C. 2 Hr | Under $N_2$ 150° C. 2 Hr | Under $N_2$ 150° C. 2 Hr |
| Transistor properties | Mobility (cm²/Vs) | 19 | 17 | 16 | 15 |
|  | On-off ratio | $10^8$ | $10^9$ | $10^{10}$ | $10^{10}$ |
|  | Off current (pA) | 0.9 | 0.15 | 0.05 | 0.05 |
|  | Gate leakage current (pA) | 0.6 | 0.09 | 0.05 | 0.05 |
|  | S value | 0.08 | 0.1 | 0.1 | 0.12 |
|  | Vth (V) | 0.3 | 0.4 | 0.5 | 0.5 |
|  | Hysteresis | Slight | Slight | Slight | Slight |
| Stress test | Threshold vol. shift Δ Vth (V) | 0.9 | 0.8 | 0.4 | 0.4 |

|  |  | Examples | | | |
| --- | --- | --- | --- | --- | --- |
|  |  | 42 | 43 | 44 | 45 |
| Method and conditions for forming semiconductor layer | Sputtering method | RF | RF | RF | RF |
|  | Total pressure (Pa) | 0.2 | 0.2 | 0.2 | 0.2 |
|  | Atmospheric gas | Ar: 99.5% $O_2$: 0.5% | Ar: 99.5% $O_2$: 0.5% | Ar: 99.5% $O_2$: 0.5% | Ar: 99.5% $O_2$: 0.5% |
| Composition of target (atomic ratio) | In/(In + Zn + X) | 0.41 | 0.39 | 0.20 | 0.30 |
|  | Zn/(In + Zn + X) | 0.43 | 0.41 | 0.72 | 0.62 |
|  | X/(In + Zn + X) | 0.16 | 0.20 | 0.08 | 0.08 |
|  | Element X | Al | Al | Al | Al |
|  | In/(In + Zn) | 0.488 | 0.488 | 0.217 | 0.326 |
|  | In/(In + X) | 0.719 | 0.661 | 0.714 | 0.789 |
|  | Zn/(X + Zn) | 0.729 | 0.672 | 0.900 | 0.886 |
| Composition of semiconductor layer (atomic ratio) | In/(In + Zn + X) | 0.42 | 0.4 | 0.22 | 0.32 |
|  | Zn/(In + Zn + X) | 0.42 | 0.4 | 0.7 | 0.6 |
|  | X/(In + Zn + X) | 0.16 | 0.2 | 0.08 | 0.08 |
|  | Element X | Al | Al | Al | Al |
|  | In/(In + Zn) | 0.500 | 0.500 | 0.239 | 0.348 |
|  | In/(In + X) | 0.724 | 0.667 | 0.733 | 0.800 |
|  | Zn/(X + Zn) | 0.724 | 0.667 | 0.897 | 0.882 |
| State of semiconductor layer | XRD | Amorphous | Amorphous | Amorphous | Amorphous |
| Members used in transistor | Substrate | Glass | Glass | Glass | Glass |
|  | Gate insulating film | SiNx | SiNx | SiNx | SiNx |
|  | Protective layer for semiconductor | None | None | None | None |
| Heat treatment |  | Under $N_2$ 150° C. 2 Hr | Under $N_2$ 150° C. 2 Hr | Under $N_2$ 150° C. 2 Hr | Under $N_2$ 150° C. 2 Hr |

TABLE 6-continued

| | | | | | |
|---|---|---|---|---|---|
| Transistor properties | Mobility (cm$^2$/Vs) | 11 | 9 | 5 | 12 |
| | On-off ratio | $10^9$ | $10^8$ | $10^8$ | $10^{10}$ |
| | Off current (pA) | 0.05 | 0.05 | 0.1 | 0.05 |
| | Gate leakage current (pA) | 0.05 | 0.05 | 0.1 | 0.05 |
| | S value | 0.2 | 0.26 | 0.29 | 0.15 |
| | Vth (V) | 0.9 | 1.5 | 1.8 | 0.6 |
| | Hysteresis | Slight | Slight | Slight | Slight |
| Stress test | Threshold vol. shift ΔVth (V) | 0.4 | 0.4 | 0.4 | 0.5 |

TABLE 7

| | | Examples | | | |
|---|---|---|---|---|---|
| | | 46 | 47 | 48 | 49 |
| Method and conditions for forming semiconductor layer | Sputtering method | RF | RF | RF | RF |
| | Total pressure (Pa) | 0.2 | 0.2 | 0.2 | 0.2 |
| | Atmospheric gas | Ar: 99.5% O$_2$: 0.5% | Ar: 99.5% O$_2$: 0.5% | Ar: 99.5% O$_2$: 0.5% | Ar: 99.5% O$_2$: 0.5% |
| Composition of target (atomic ratio) | In/(In + Zn + X) | 0.59 | 0.69 | 0.45 | 0.48 |
| | Zn/(In + Zn + X) | 0.33 | 0.23 | 0.21 | 0.50 |
| | X/(In + Zn + X) | 0.08 | 0.08 | 0.32 | 0.02 |
| | Element X | Al | Al | Al | B |
| | In/(In + Zn) | 0.641 | 0.750 | 0.682 | 0.490 |
| | In/(In + X) | 0.881 | 0.896 | 0.684 | 0.960 |
| | Zn/(X + Zn) | 0.805 | 0.742 | 0.396 | 0.962 |
| Composition of semiconductor layer (atomic ratio) | In/(In + Zn + X) | 0.60 | 0.70 | 0.46 | 0.49 |
| | Zn/(In + Zn + X) | 0.32 | 0.22 | 0.20 | 0.49 |
| | X/(In + Zn + X) | 0.08 | 0.08 | 0.32 | 0.02 |
| | Element X | Al | Al | Al | B |
| | In/(In + Zn) | 0.652 | 0.761 | 0.697 | 0.500 |
| | In/(In + X) | 0.882 | 0.897 | 0.590 | 0.961 |
| | Zn/(X + Zn) | 0.800 | 0.733 | 0.385 | 0.961 |
| State of semiconductor layer | XRD | Amorphous | Amorphous | Amorphous | Amorphous |
| Members used in transistor | Substrate | Glass | Glass | Glass | Glass |
| | Gate insulating film | SiN$x$ | SiN$x$ | SiN$x$ | SiN$x$ |
| | Protective layer for semiconductor | None | None | None | None |
| Heat treatment | | Under N$_2$ 150° C. 2 Hr | Under N$_2$ 150° C. 2 Hr | Under N$_2$ 150° C. 2 Hr | Under N$_2$ 150° C. 2 Hr |
| Transistor properties | Mobility (cm$^2$/Vs) | 18 | 27 | 6 | 18 |
| | On-off ratio | $10^8$ | $10^8$ | $10^8$ | $10^8$ |
| | Off current (pA) | 0.5 | 1.3 | 0.05 | 0.9 |
| | Gate leakage current (pA) | 0.3 | 0.5 | 0.05 | 0.6 |
| | S value | 0.9 | 0.39 | 0.49 | 0.09 |
| | Vth (V) | 0.4 | 0.18 | 0.28 | 0.3 |
| | Hysteresis | Slight | Slight | Slight | Slight |
| Stress test | Threshold vol. shift ΔVth (V) | 0.5 | 0.4 | 0.4 | 0.9 |

| | | Examples | | | |
|---|---|---|---|---|---|
| | | 50 | 51 | 52 | 53 |
| Method and conditions for forming semiconductor layer | Sputtering method | RF | RF | RF | RF |
| | Total pressure (Pa) | 0.2 | 0.2 | 0.2 | 0.2 |
| | Atmospheric gas | Ar: 99.5% O$_2$: 0.5% | Ar: 99.5% O$_2$: 0.5% | Ar: 99.5% O$_2$: 0.5% | Ar: 99.5% O$_2$: 0.5% |
| Composition of target (atomic ratio) | In/(In + Zn + X) | 0.48 | 0.48 | 0.48 | 0.48 |
| | Zn/(In + Zn + X) | 0.50 | 0.50 | 0.50 | 0.50 |
| | X/(In + Zn + X) | 0.02 | 0.02 | 0.02 | 0.02 |
| | Element X | Y | Sc | Ce | Nd |
| | In/(In + Zn) | 0.490 | 0.490 | 0.490 | 0.490 |
| | In/(In + X) | 0.960 | 0.960 | 0.960 | 0.960 |
| | Zn/(X + Zn) | 0.962 | 0.962 | 0.962 | 0.962 |
| Composition of semiconductor layer (atomic ratio) | In/(In + Zn + X) | 0.49 | 0.49 | 0.49 | 0.49 |
| | Zn/(In + Zn + X) | 0.49 | 0.49 | 0.49 | 0.49 |
| | X/(In + Zn + X) | 0.02 | 0.02 | 0.02 | 0.02 |
| | Element X | Y | Sc | Ce | Nd |
| | In/(In + Zn) | 0.500 | 0.500 | 0.500 | 0.500 |
| | In/(In + X) | 0.961 | 0.961 | 0.961 | 0.961 |
| | Zn/(X + Zn) | 0.961 | 0.961 | 0.961 | 0.961 |
| State of semiconductor layer | XRD | Amorphous | Amorphous | Amorphous | Amorphous |

TABLE 7-continued

| Members used in transistor | Substrate | Glass | Glass | Glass | Glass |
|---|---|---|---|---|---|
| | Gate insulating film | SiNx | SiNx | SiNx | SiNx |
| | Protective layer for semiconductor | None | None | None | None |
| Heat treatment | | Under $N_2$ 150° C. 2 Hr | Under $N_2$ 150° C. 2 Hr | Under $N_2$ 150° C. 2 Hr | Under $N_2$ 150° C. 2 Hr |
| Transistor properties | Mobility (cm$^2$/Vs) | 18 | 18 | 18 | 18 |
| | On-off ratio | $10^8$ | $10^8$ | $10^8$ | $10^8$ |
| | Off current (pA) | 0.9 | 0.9 | 0.9 | 0.9 |
| | Gate leakage current (pA) | 0.6 | 0.6 | 0.6 | 0.6 |
| | S value | 0.09 | 0.09 | 0.09 | 0.09 |
| | Vth (V) | 0.3 | 0.3 | 0.3 | 0.3 |
| | Hysteresis | Slight | Slight | Slight | Slight |
| Stress test | Threshold vol. shift ΔVth (V) | 0.9 | 0.9 | 0.9 | 0.9 |

TABLE 8

| | | Examples | | | |
|---|---|---|---|---|---|
| | | 54 | 55 | 56 | 57 |
| Method and conditions for forming semiconductor layer | Sputtering method | RF | RF | RF | RF |
| | Total pressure (Pa) | 0.2 | 0.2 | 0.2 | 0.2 |
| | Atmospheric gas | Ar: 99.5% $O_2$: 0.5% | Ar: 99.5% $O_2$: 0.5% | Ar: 99.5% $O_2$: 0.5% | Ar: 99.5% $O_2$: 0.5% |
| Composition of target (atomic ratio) | In/(In + Zn + X) | 0.48 | 0.48 | 0.48 | 0.48 |
| | Zn/(In + Zn + X) | 0.50 | 0.50 | 0.50 | 0.50 |
| | X/(In + Zn + X) | 0.02 | 0.02 | 0.02 | 0.02 |
| | Element X | Sm | Gd | Tb | Yb |
| | In/(In + Zn) | 0.490 | 0.490 | 0.490 | 0.490 |
| | In/(In + X) | 0.960 | 0.960 | 0.960 | 0.960 |
| | Zn/(X + Zn) | 0.962 | 0.962 | 0.962 | 0.962 |
| Composition of semiconductor layer (atomic ratio) | In/(In + Zn + X) | 0.49 | 0.49 | 0.49 | 0.49 |
| | Zn/(In + Zn + X) | 0.49 | 0.49 | 0.49 | 0.49 |
| | X/(In + Zn + X) | 0.02 | 0.02 | 0.02 | 0.02 |
| | Element X | Sm | Gd | Tb | Yb |
| | In/(In + Zn) | 0.500 | 0.500 | 0.500 | 0.500 |
| | In/(In + X) | 0.961 | 0.961 | 0.961 | 0.961 |
| | Zn/(X + Zn) | 0.961 | 0.961 | 0.961 | 0.961 |
| State of semiconductor layer | XRD | Amorphous | Amorphous | Amorphous | Amorphous |
| Members used in transistor | Substrate | Glass | Glass | Glass | Glass |
| | Gate insulating film | SiNx | SiNx | SiNx | SiNx |
| | Protective layer for semiconductor | None | None | None | None |
| Heat treatment | | Under $N_2$ 150° C. 2 Hr | Under $N_2$ 150° C. 2 Hr | Under $N_2$ 150° C. 2 Hr | Under $N_2$ 150° C. 2 Hr |
| Transistor properties | Mobility (cm$^2$/Vs) | 18 | 18 | 18 | 18 |
| | On-off ratio | $10^8$ | $10^8$ | $10^8$ | $10^8$ |
| | Off current (pA) | 0.9 | 0.9 | 0.9 | 0.9 |
| | Gate leakage current (pA) | 0.6 | 0.6 | 0.6 | 0.6 |
| | S value | 0.09 | 0.09 | 0.09 | 0.09 |
| | Vth (V) | 0.3 | 0.3 | 0.3 | 0.3 |
| | Hysteresis | Slight | Slight | Slight | Slight |
| Stress test | Threshold vol. shift ΔVth (V) | 0.9 | 0.9 | 0.9 | 0.9 |
| | | Examples | | | |
| | | 58 | 59 | 60 | 61 |
| Method and conditions for forming semiconductor layer | Sputtering method | RF | DC | RF | RF |
| | Total pressure (Pa) | 0.2 | 0.2 | 0.2 | 0.2 |
| | Atmospheric gas | Ar: 99.5% $O_2$: 0.5% | Ar: 99% $O_2$: 1% | Ar: 99.5% $O_2$: 0.5% | Ar: 99.5% $O_2$: 0.5% |
| Composition of target (atomic ratio) | In/(In + Zn + X) | 0.47 | 0.47 | 0.48 | 0.31 |
| | Zn/(In + Zn + X) | 0.49 | 0.49 | 0.50 | 0.33 |
| | X/(In + Zn + X) | 0.04 | 0.04 | 0.02 | 0.36 |
| | Element X | Al | Al | Al | Al |
| | In/(In + Zn) | 0.490 | 0.490 | 0.500 | 0.484 |
| | In/(In + X) | 0.922 | 0.922 | 0.961 | 0.463 |
| | Zn/(X + Zn) | 0.925 | 0.925 | 0.961 | 0.478 |
| Composition of semiconductor layer (atomic ratio) | In/(In + Zn + X) | 0.48 | 0.48 | 0.49 | 0.32 |
| | Zn/(In + Zn + X) | 0.48 | 0.48 | 0.49 | 0.32 |
| | X/(In + Zn + X) | 0.04 | 0.04 | 0.02 | 0.36 |
| | Element X | Al | Al | Al | Al |
| | In/(In + Zn) | 0.500 | 0.500 | 0.500 | 0.500 |

TABLE 8-continued

|  |  |  |  |  |  |
|---|---|---|---|---|---|
|  | In/(In + X) | 0.923 | 0.923 | 0.961 | 0.471 |
|  | Zn/(X + Zn) | 0.923 | 0.923 | 0.961 | 0.471 |
| State of semiconductor layer | XRD | Amorphous | Amorphous | Amorphous | Amorphous |
| Members used in transistor | Substrate | Glass | Glass | Silicon | Glass |
|  | Gate insulating film | SiNx | SiNx | SiO$_2$ Thermally oxidized film | SiNx |
|  | Protective layer for semiconductor | SiO$_2$ | None | None | None |
| Heat treatment |  | Under N$_2$ 150° C. 2 Hr | Under N$_2$ 150° C. 2 Hr | Under N$_2$ 150° C. 2 Hr | Under N$_2$ 150° C. 2 Hr |
| Transistor properties | Mobility (cm$^2$/Vs) | 17 | 18 | 18 | 1 |
|  | On-off ratio | 10$^9$ | 10$^{10}$ | 10$^{10}$ | 10$^7$ |
|  | Off current (pA) | 0.05 | 0.05 | 0.05 | 0.05 |
|  | Gate leakage current (pA) | 0.05 | 0.05 | 0.05 | 0.05 |
|  | S value | 0.12 | 0.09 | 0.2 | 0.35 |
|  | Vth (V) | 0.3 | 0.3 | 0.2 | 3 |
|  | Hysteresis | Slight | Slight | Slight | Slight |
| Stress test | Threshold vol. shift Δ Vth (V) | 0.8 | 0.4 | 0.6 | 0.4 |

TABLE 9

|  |  | Com. Examples |  |  |  |  |
|---|---|---|---|---|---|---|
|  |  | 11 | 12 | 13 | 14 | 15 |
| Method and conditions for forming semiconductor layer | Sputtering method | RF | RF | RF | RF | RF |
|  | Total pressure (Pa) | 0.2 | 0.2 | 0.2 | 0.2 | 0.2 |
|  | Atmospheric gas | Ar: 99.5% O$_2$: 0.5% | Ar: 99.5% O$_2$: 0.5% | Ar: 99.5% O$_2$: 0.5% | Ar: 99.5% O$_2$: 0.5% | Ar: 99.5% O$_2$: 0.5% |
| Composition of target (atomic ratio) | In/(In + Zn + X) | 0.49 | 0.02 | 0.49 | 0.2 | 0.1 |
|  | Zn/(In + Zn + X) | 0.51 | 0.5 | 0.02 | 0.2 | 0.1 |
|  | X/(In + Zn + X) |  | 0.48 | 0.49 | 0.6 | 0.8 |
|  | Element X | — | Al | Al | Al | Al |
|  | In/(In + Zn) | 0.490 | 0.038 | 0.961 | 0.500 | 0.500 |
|  | In/(In + X) | 1.000 | 0.040 | 0.500 | 0.250 | 0.111 |
|  | Zn/(X + Zn) | 1.000 | 0.510 | 0.039 | 0.250 | 0.111 |
| Composition of semiconductor layer (atomic ratio) | In/(In + Zn + X) | 0.5 | 0.02 | 0.49 | 0.2 | 0.1 |
|  | Zn/(In + Zn + X) | 0.5 | 0.49 | 0.02 | 0.2 | 0.1 |
|  | X/(In + Zn + X) |  | 0.49 | 0.49 | 0.6 | 0.8 |
|  | Element X | — | Al | Al | Al | Al |
|  | In/(In + Zn) | 0.500 | 0.039 | 0.961 | 0.500 | 0.500 |
|  | In/(In + X) | 1.000 | 0.039 | 0.500 | 0.250 | 0.111 |
|  | Zn/(X + Zn) | 1.000 | 0.500 | 0.039 | 0.250 | 0.111 |
| State of semiconductor layer | XRD | Amorphous | Amorphous | Amorphous | Amorphous | Polycrystalline |
| Members used in transistor | Substrate | Glass | Glass | Glass | Glass | Glass |
|  | Gate insulating film | SiNx | SiNx | SiNx | SiNx | SiNx |
|  | Protective layer for semiconductor | None | None | None | None | None |
| Heat treatment |  | Under N$_2$ 150° C. 2 Hr | Under N$_2$ 150° C. 2 Hr | Under N$_2$ 150° C. 2 Hr | Under N$_2$ 150° C. 2 Hr | Under N$_2$ 150° C. 2 Hr |
| Transistor properties | Mobility (cm$^2$/Vs) | 21 | — | 0.5 | 0.05 | — |
|  | On-off ratio | 10$^7$ | — | 10$^3$ | 10$^2$ | — |
|  | Off current (pA) | 5 | — | 10 | 5 | — |
|  | Gate leakage current (pA) | 2 | — | 2 | 2 | — |
|  | S value | 0.1 | — | 2 | 5 | — |
|  | Vth (V) | 0.3 | — | 6 | 13 | — |
|  | Hysteresis | Slight | — | Slight | Slight | — |
| Stress test | Threshold vol. shift Δ Vth (V) | 1.8 | — | 2 | 1.9 | — |
| Remarks |  |  | Not driven |  |  | Not driven |

|  |  | Com. Examples |  |  |
|---|---|---|---|---|
|  |  | 16 | 17 | 18 |
| Method and conditions for forming semiconductor layer | Sputtering method | RF | RF | RF |
|  | Total pressure (Pa) | 0.2 | 0.2 | 0.2 |
|  | Atmospheric gas | Ar: 99.5% O$_2$: 0.5% | Ar: 99.5% O$_2$: 0.5% | Ar: 99.5% O$_2$: 0.5% |
| Composition of target (atomic ratio) | In/(In + Zn + X) | 1 |  |  |
|  | Zn/(In + Zn + X) |  | 1 |  |
|  | X/(In + Zn + X) |  |  | 1 |
|  | Element X |  |  | Al |
|  | In/(In + Zn) | 1.000 | — | — |

TABLE 9-continued

|  |  |  |  |  |
|---|---|---|---|---|
| Composition of semiconductor layer (atomic ratio) | In/(In + X) | 1.000 | — | — |
|  | Zn/(X + Zn) | — | 1.000 | — |
|  | In/(In + Zn + X) | 1 | — | — |
|  | Zn/(In + Zn + X) | — | 1 | — |
|  | X/(In + Zn + X) | — | — | 1 |
|  | Element X | — | — | Al |
|  | In/(In + Zn) | 1.000 | — | — |
|  | In/(In + X) | 1.000 | — | — |
|  | Zn/(X + Zn) | — | 1.000 | — |
| State of semiconductor layer | XRD | Polycrystalline | Polycrystalline | Polycrystalline |
| Members used in transistor | Substrate | Glass | Glass | Glass |
|  | Gate insulating film | SiNx | SiNx | SiNx |
|  | Protective layer for semiconductor | None | None | None |
|  | Heat treatment | Under $N_2$ 150° C. 2 Hr | Under $N_2$ 150° C. 2 Hr | Under $N_2$ 150° C. 2 Hr |
| Transistor properties | Mobility (cm$^2$/Vs) | — | 0.01 | — |
|  | On-off ratio | — | $10^3$ | — |
|  | Off current (pA) | 1000000 | 1 | — |
|  | Gate leakage current (pA) | 1000000 | 1 | — |
|  | S value | — | 0.4 | — |
|  | Vth (V) | Normally on | −0.5 | — |
|  | Hysteresis | — | Moderate | — |
| Stress test | Threshold vol. shift Δ Vth (V) | — | 5 | — |
| Remarks |  | Not driven |  | Not driven |

In the thin film formed in Comparative Example 17, the average In—In bonding distance obtained by the X-ray absorption spectroscopy was 0.325 nm. Further, from the relationship between the carrier concentration and the activation energy measured by using the hall effect, the energy width ($E_0$) on the non-localized level was 22 meV or less.

Heat Treatment Temperature and Effects

Figure 7:
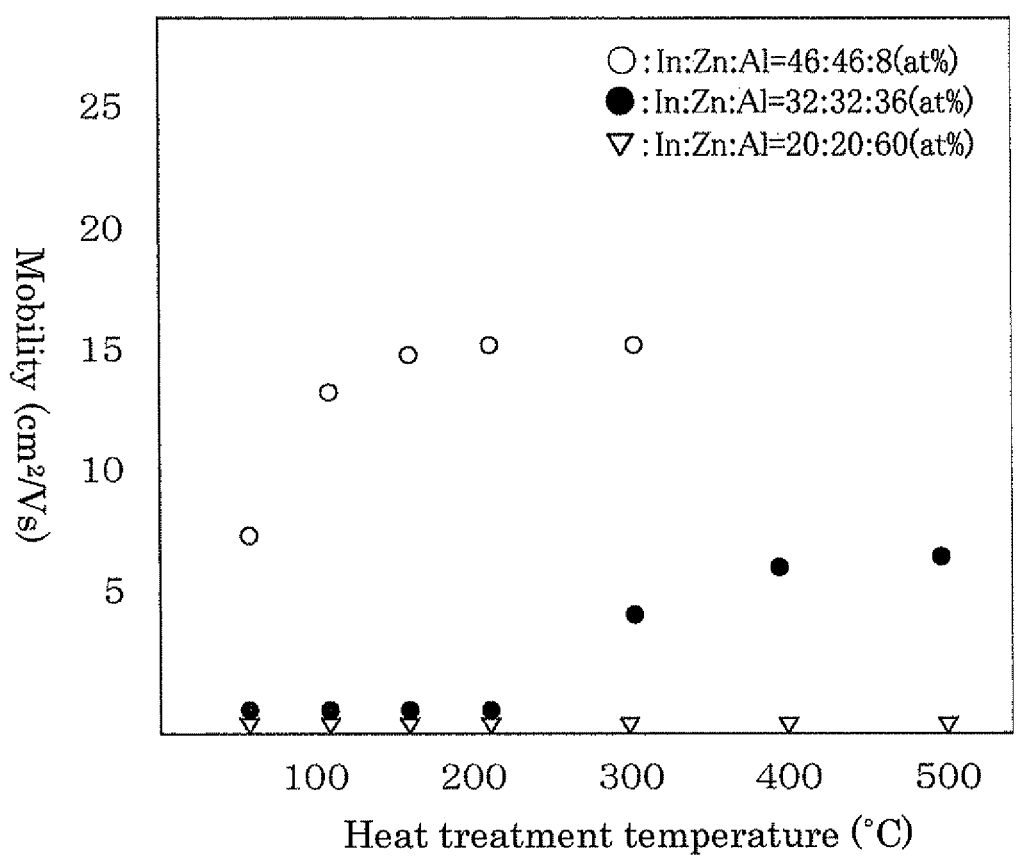
FIG. 7 is a graph showing the relationship between the heat treatment temperature and the mobility of the semiconductor layer.

FIG. 7 shows the relationship between the heat treatment temperature and the mobility for the semiconductor layers in Example 41, Example 61 and Comparative Example 14 which have the same composition. The heat treatment was conducted for 2 hours.

The mobility stabilized at 150° C. with the composition of Example 41. However, with the composition of Example 61, a heat treatment of 300° C. or higher was required to stabilize the mobility. It was confirmed that, in Comparative Example 14, a heat treatment at 400° C. or higher was not effective.

INDUSTRIAL APPLICABILITY

The field effect transistor of the invention can be applied to an integrated circuit such as a logical circuit, a memory circuit, a differential amplification circuit. In particular, the field effect transistor of the invention can be used as a switching element for driving a liquid crystal display or an organic EL display.

The invention claimed is:

1. A field effect transistor comprising a gate electrode, a source electrode, a drain electrode and a semiconductor layer, said semiconductor layer comprising a composite oxide which comprises In, Zn, and one or more elements X selected from the group consisting of Zr, Hf, Ge, Si, Ti, Mn, W, Mo, V, Cu, Ni, Co, Fe, Cr, Nb, Al, B, Sc, Y, La, Ce, Pr, Nd, Sm, Eu, Gd, Tb, Dy, Ho, Er, Tm, Yb and Lu in the following atomic ratios (1) to (3):

In/(In+Zn)=0.2 to 0.8    (1)

In/(In+X)=0.29 to 0.99    (2)

Zn/(X+Zn)=0.29 to 0.99    (3).

2. The field effect transistor according to claim 1, wherein element X is one or more elements selected from the group consisting of Al, B, Sc, Y, La, Ce, Pr, Nd, Sm, Eu, Gd, Tb, Dy, Ho, Er, Tm, Yb and Lu and the semiconductor layer comprises element X in the following atomic ratio (2)':

In/(In+X)=0.59 to 0.99    (2)'.

3. The field effect transistor according to claim 1, wherein element X is Al or B.

4. The field effect transistor according to claim 1, wherein element X is Sc or Y.

5. The field effect transistor according to claim 1, wherein element X is one or more elements selected from the group consisting of La, Ce, Pr, Nd, Sm, Eu, Gd, Tb, Dy, Ho, Er, Tm, Yb and Lu.

6. The field effect transistor according to claim 1, wherein element X is Zr.

7. The field effect transistor according to claim 1, wherein the semiconductor layer is an amorphous film which has an electron carrier concentration of $10^{13}$ to $10^{18}$/cm$^3$ and a band gap of 2.0 to 6.0 eV.

8. The field effect transistor according to claim 1, wherein the semiconductor layer is a nondegenerate semiconductor.

9. The field effect transistor according to claim 1, wherein said semiconductor layer comprises a composite oxide which comprises In, Zn, and one or more elements X selected from the group consisting of Zr, Hf, Ge, Si, Ti, Mn, Mo, V, Cu, Co, Cr, Nb, Al, B, Sc, Y, Ce, Pr, Nd, Sm, Eu, Gd, Tb, Dy, Er, Tm, Yb and Lu.

10. The field effect transistor according to claim 1, wherein said semiconductor layer comprises a composite oxide which comprises In, Zn, and one or more elements X selected from the group consisting of Zr, Hf, Ge, Si, Ti, Al and Y.

11. The field effect transistor according to claim 1, wherein said field effect transistor has a mobility of 1 cm$^2$/Vs or more.

12. The field effect transistor according to claim 1, wherein said field effect transistor has an on-off ratio of $10^6$ or more.

13. The field effect transistor according to claim 1, wherein said field effect transistor has an S value of 0.8 V/dec or less.

14. The field effect transistor according to claim 1, wherein said field effect transistor has an S value of 0.3 V/dec or less.

15. The field effect transistor according to claim 1, wherein said composite oxide comprises In, Zn, and one or more elements X in the following atomic ratios (1) to (3):

$$In/(In+Zn)=0.35 \text{ to } 0.7 \quad (1)$$

$$In/(In+X)=0.45 \text{ to } 0.98 \quad (2)$$

$$Zn/(X+Zn)=0.6 \text{ to } 0.98 \quad (3).$$

16. A target comprising a composite oxide which comprises In, Zn, and one or more elements X wherein element X is one or more elements selected from the group consisting of Al, B, Sc, Y, La, Ce, Pr, Nd, Sm, Eu, Gd, Tb, Dy, Ho, Er, Tm, Yb and Lu in the following atomic ratios (1) to (3):

$$In/(In+Zn)=0.2 \text{ to } 0.8 \quad (1)$$

$$In/(In+X)=0.29 \text{ to } 0.99 \quad (2)$$

$$Zn/(X+Zn)=0.29 \text{ to } 0.99 \quad (3),$$

and wherein the target further comprises one or more elements selected from the group consisting of Sn, Ge, Si, Ti, Zr and Hf in an amount of 100 to 10000 atomic ppm.

17. A method for producing a field effect transistor comprising forming a semiconductor layer by DC or AC sputtering using a target comprising a composite oxide which comprises In, Zn, and one or more elements X selected from the group consisting of Zr, Hf, Ge, Si, Ti, Mn, W, Mo, V, Cu, Ni, Co, Fe, Cr, Nb, Al, B, Sc, Y, La, Ce, Pr, Nd, Sm, Eu, Gd, Tb, Dy, Ho, Er, Tm, Yb and Lu in the following atomic ratios (1) to (3):

$$In/(In+Zn)=0.2 \text{ to } 0.8 \quad (1)$$

$$In/(In+X)=0.29 \text{ to } 0.99 \quad (2)$$

$$Zn/(X+Zn)=0.29 \text{ to } 0.99 \quad (3),$$

and subjecting the semiconductor layer to a heat treatment at 70 to 350° C.

* * * * *